United States Patent
Kim et al.

(10) Patent No.: US 10,346,564 B2
(45) Date of Patent: Jul. 9, 2019

(54) DYNAMIC VIRTUAL OBJECT GENERATION FOR TESTING AUTONOMOUS VEHICLES IN SIMULATED DRIVING SCENARIOS

(71) Applicant: TOYOTA JIDOSHA KABUSHIKI KAISHA, Toyota-shi, Aichi-ken (JP)

(72) Inventors: BaekGyu Kim, Cupertino, CA (US); Shinichi Shiraishi, San Jose, CA (US); Jonathan Shum, Mountain View, CA (US)

( * ) Notice: Subject to any disclaimer, the term of this patent is extended or adjusted under 35 U.S.C. 154(b) by 591 days.

(21) Appl. No.: 15/085,664

(22) Filed: Mar. 30, 2016

(65) Prior Publication Data
US 2017/0286570 A1  Oct. 5, 2017

(51) Int. Cl.
*G06F 17/50* (2006.01)

(52) U.S. Cl.
CPC ...... *G06F 17/5009* (2013.01); *G06F 17/5095* (2013.01)

(58) Field of Classification Search
CPC . G06F 17/5009; G06F 17/5095; G05B 15/02; G06Q 40/08
USPC .......................................................... 703/8
See application file for complete search history.

(56) References Cited

U.S. PATENT DOCUMENTS

| | | | |
|---|---|---|---|
| 8,103,435 B2 * | 1/2012 | Yang | G01C 21/3492 701/117 |
| 9,365,155 B2 * | 6/2016 | Hathaway | B60Q 1/525 |
| 9,483,948 B1 * | 11/2016 | Gordon | G08G 1/166 |
| 9,507,346 B1 * | 11/2016 | Levinson | G05D 1/0214 |
| 9,715,711 B1 * | 7/2017 | Konrardy | H04W 4/90 |
| 2013/0124148 A1 * | 5/2013 | Jin | G06F 17/5086 703/1 |
| 2014/0156584 A1 * | 6/2014 | Motukuri | G06N 5/048 706/52 |

(Continued)

OTHER PUBLICATIONS

Xuehua Liao et. al., "Traffic Accident Reconstruction Technology Research and Simulation Realization", IEEE 2012, p. 152-155. (Year: 2012).*

(Continued)

*Primary Examiner* — Rehana Perveen
*Assistant Examiner* — Justin C Mikowski
(74) *Attorney, Agent, or Firm* — Burbage Law, P.C.; Jon-Michael Burbage; Elizabeth Ruzich

(57) ABSTRACT

A system, method and tangible memory provides a graphical display output including a simulation for testing a design for a vehicle. The method extracts object data from accident data describing an object that contributed to a roadway accident occurring in a real world. The method extracts behavior data from the accident data describing the erroneous behavior of the object. The method constructs an error model that describes a virtual object that represents the object in the simulation based in part on the behavior data, a frequency input and a severity input. The method generates the graphical display output including the simulation based on a roadway model, a vehicle model and the error model. The simulation graphically depicts a virtual vehicle present on a virtual roadway system that includes the virtual object behaving dynamically in the simulation based on the error model.

20 Claims, 10 Drawing Sheets

(56) References Cited

U.S. PATENT DOCUMENTS

| | | | | |
|---|---|---|---|---|
| 2015/0112543 A1* | 4/2015 | Binion | ............... | B60W 40/10 |
| | | | | 701/32.2 |
| 2015/0112731 A1* | 4/2015 | Binion | ............... | G06Q 40/08 |
| | | | | 705/4 |
| 2015/0310758 A1* | 10/2015 | Daddona | ............... | G09B 9/02 |
| | | | | 434/62 |
| 2016/0264115 A1* | 9/2016 | Schwindt | ............... | B60T 8/885 |
| 2016/0304028 A1* | 10/2016 | Hathaway | ............... | B60Q 9/008 |

OTHER PUBLICATIONS

Cai Linqin et. al., "Modeling Risk Behaviors in Virtual Environment based on Multi-agent", IEEE 2010, p. 445-448. (Year: 2010).*

Xuefeng Yan et. al., "Dynamic Data Driven Event Reconstruction for Traffic Simulation Using Sequential Monte Carlo Methods", IEEE 2013, p. 2042-2053. (Year: 2013).*

Chung-Ping Young et. al., "Highway Vehicle Accident Reconstruction Using Cooperative Collision Warning Based Motor Vehicle Event Data Recorder", IEEE 2009, p. 1131-1136. (Year: 2009).*

* cited by examiner

DYNAMIC VIRTUAL OBJECT GENERATION FOR TESTING AUTONOMOUS VEHICLES IN SIMULATED DRIVING SCENARIOS

BACKGROUND

The specification relates to dynamic virtual object generation for testing autonomous vehicles in simulated driving scenarios.

Roadway virtualization software exists in the marketplace. Roadway virtualization software is a software package that predicts the performance of vehicles in response to virtualized driver controls (steering, throttle, brakes, clutch and shifting) in a virtual simulation (herein "a simulation"). An example of such software includes CarSim and Prescan, among others.

SUMMARY

An example implementation of an automated dynamic object generation system is depicted in FIG. 5. In some implementations, the automated dynamic object generation system may automatically generate dynamic virtual objects that introduce erroneous behavior in a simulation provided by a virtual simulation software. In order to categorize the erroneous behavior of dynamic objects that can happen in the real world, the automated dynamic object generation system may extract data from an accident database that describes real world roadway accidents.

The extracted data may include object data that describes one or more objects that caused or contributed to an occurrence of a roadway accident described by the accident database.

From this categorization, the automated dynamic object generation system may extract a set of random variables that characterize the erroneous behavior of the object described by the object data. The set of random variables may be used to generate a virtual dynamic object in a simulation (provided by the virtual simulation software) that behave in a similar manner as the object described by the object data did in the real world as described by the accident database. In some implementations, the automated dynamic object generation system may extract behavior data from the accident database that describes the set of random variables for the object described by the object data. This process may be repeated for multiple objects included in the accident database to create multiple virtual dynamic objects for inclusion in a simulation.

A design engineer may provide a user input to the automated dynamic object generation system describing a probability distribution depending on their preferences for: (1) how frequently the dynamic virtual object will behave erroneously in the simulation; and (2) how severe the erroneous behavior will be in the simulation. The automated dynamic object generation system may associate this user input (i.e., the probability distribution) with the extracted random variables for a given object in order to construct one or more error models for a virtual dynamic object that represents the object in the simulation. The automated dynamic object generation system may provide the error model to the virtual simulation software. The error model may automatically generate the information necessary for the simulation tool to visualize (e.g., graphically depict) the dynamic virtual object in the simulation that behaves according to the probabilistic distribution.

Those visualized dynamic virtual objects in the virtual simulation software can then be integrated with static road structures, such as roadway with features such as intersections, stop signs, etc. In this way the virtual simulation software can provide a simulation that tests a vehicle design. In some implementations, the vehicle design may include an autonomous vehicle that include software that must react to the dynamic virtual objects in order to avoid a roadway accident or minimize the severity of the roadway accident.

A system of one or more computers can be configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions.

One general aspect includes a system to provide a graphical display output including a simulation for testing a design for a vehicle, where the simulation includes a virtual roadway system for testing a virtual vehicle that represents the design for the vehicle in the simulation, the system including: a non-transitory memory, a processor, an automated dynamic object generation system and a virtualization application, where the automated dynamic object generation system and the virtualization application are stored in the non-transitory memory which is communicatively coupled to the processor; where the non-transitory memory stores accident data that describes a roadway accident that actually occurred in a real world, a roadway model that describes the virtual roadway system for including in the simulation and a vehicle model that describes the virtual vehicle for including in the simulation; where the automated dynamic object generation system includes instructions that, responsive to being executed by the processor, cause the processor to: extract object data from the accident data, where the object data describes an object included in the accident data that contributed to the roadway accident occurring in the real world; extract behavior data from the accident data, where the behavior data describes an erroneous behavior of the object in the real world that contributed to the roadway accident occurring in the real world; receive user input data that describes a frequency of the object behaving erroneously in the simulation and a severity of the erroneous behavior of the object in the simulation; and construct an error model that describes a virtual object that represents the object in the simulation, where the error model is constructed based on the object data, the behavior data and the user input data so that the virtual object behaves erroneously in the simulation as described by the behavior data and the user input data; and where the virtualization application includes instructions that, responsive to being executed by the processor, cause the processor to generate the graphical display output including the simulation based on the roadway model, the vehicle model and the error model, where the simulation includes graphics that graphically depict the virtual vehicle, the virtual roadway system and the virtual object, where the virtual object behaves dynamically in the simulation based on the error model. Other embodiments of this aspect include corresponding computer systems, apparatus, and computer programs recorded on one or more computer storage devices, each configured to perform the actions of the methods.

Implementations may include one or more of the following features. The system where the graphical display output is displayed on a monitor. The system where the accident data is imported from a National Highway and Traffic Safety Administration database (or some other source or combination of sources of accident data). The system where the user input data includes a probability distribution that describes the frequency and the severity. The system where the virtual object and the error model are automatically generated based on the user input and no other inputs from a user. The system where the automated dynamic object generation system causes a monitor to display one or more graphical fields that are usable to provide the user input to the automated dynamic object generation system. The system where the automated dynamic object generation system is a plugin for the virtualization application. Implementations of the described techniques may include hardware, a method or process, or computer software on a computer-accessible medium.

One general aspect includes a method to provide a graphical display output including a simulation for testing a design for a vehicle, where the simulation includes a virtual roadway system for testing a virtual vehicle that represents the design for the vehicle in the simulation, the method including: extracting object data from a set of accident data stored on a non-transitory memory, where the object data describes an object included in the accident data that contributed to a roadway accident occurring in a real world; extracting behavior data from the accident data, where the behavior data describes an erroneous behavior of the object in the real world that contributed to the roadway accident occurring in the real world; receiving user input data that describes a frequency of the object behaving erroneously in the simulation and a severity of the erroneous behavior of the object in the simulation; constructing an error model that describes a virtual object that represents the object in the simulation, where the error model is constructed based on the object data, the behavior data and the user input data so that the virtual object behaves in the simulation based on the behavior data and the user input data; and generating the graphical display output including the simulation based on (1) a roadway model that describes the virtual roadway system, (2) a vehicle model that describes the virtual vehicle and (3) the error model, where the simulation includes graphics that graphically depict the virtual vehicle present on the virtual roadway system that includes the virtual object behaving dynamically in the simulation based on the error model. Other embodiments of this aspect include corresponding computer systems, apparatus, and computer programs recorded on one or more computer storage devices, each configured to perform the actions of the methods.

Implementations may include one or more of the following features. The method where the graphical display output is displayed on a monitor. The method where the accident data is imported from a National Highway and Traffic Safety Administration database (or some other source or combination of sources of accident data). The method where the user input data includes a probability distribution that describes the frequency and the severity. The method where the virtual object and the error model are automatically generated based on the user input and no other inputs from a user. The method where the virtual vehicle represents an autonomous vehicle and the virtual object is present in the simulation to test how the design for the autonomous vehicle responds to the behavior of the virtual object in the simulation. The method where the simulation includes a positive whole number of the virtual objects based on the frequency described by the user input data, where the positive whole number is proportional to the frequency. Implementations of the described techniques may include hardware, a method or process, or computer software on a computer-accessible medium.

One general aspect includes a non-transitory memory including computer code which, when executed by a processor, causes the processor to perform steps to provide a graphical display output including a simulation for testing a design for a vehicle, where the simulation includes a virtual roadway system for testing a virtual vehicle that represents the design for the vehicle in the simulation, the steps including: extracting object data from a set of accident data stored on a non-transitory memory, where the object data describes an object included in the accident data that contributed to a roadway accident occurring in a real world; extracting behavior data from the accident data, where the behavior data describes an erroneous behavior of the object in the real world that contributed to the roadway accident occurring in the real world; receiving user input data that describes a frequency of the object behaving erroneously in the simulation and a severity of the erroneous behavior of the object in the simulation; constructing an error model that describes a virtual object that represents the object in the simulation, where the error model is constructed based on the object data, the behavior data and the user input data so that the virtual object behaves in the simulation based on the behavior data and the user input data; and generating the graphical display output including the simulation based on (1) a roadway model that describes the virtual roadway system, (2) a vehicle model that describes the virtual vehicle and (3) the error model, where the simulation includes graphics that graphically depict the virtual vehicle present on the virtual roadway system that includes the virtual object behaving dynamically in the simulation based on the error model. Other embodiments of this aspect include corresponding computer systems, apparatus, and computer programs recorded on one or more computer storage devices, each configured to perform the actions of the methods.

Implementations may include one or more of the following features. The non-transitory memory where the graphical display output is displayed on a monitor. The non-transitory memory where the accident data is imported from a National Highway and Traffic Safety Administration database (or some other source or combination of sources of accident data). The non-transitory memory where the user input data includes a probability distribution that describes the frequency and the severity. The non-transitory memory where the virtual object and the error model are automatically generated based on the user input and no other inputs from a user. The non-transitory memory where the virtual vehicle represents an autonomous vehicle and the virtual object is present in the simulation to test how the design for the autonomous vehicle responds to the behavior of the virtual object in the simulation. Implementations of the described techniques may include hardware, a method or process, or computer software on a computer-accessible medium.

BRIEF DESCRIPTION OF THE DRAWINGS

The disclosure is illustrated by way of example, and not by way of limitation in the figures of the accompanying drawings in which like reference numerals are used to refer to similar elements.

DETAILED DESCRIPTION

Figure 1A:
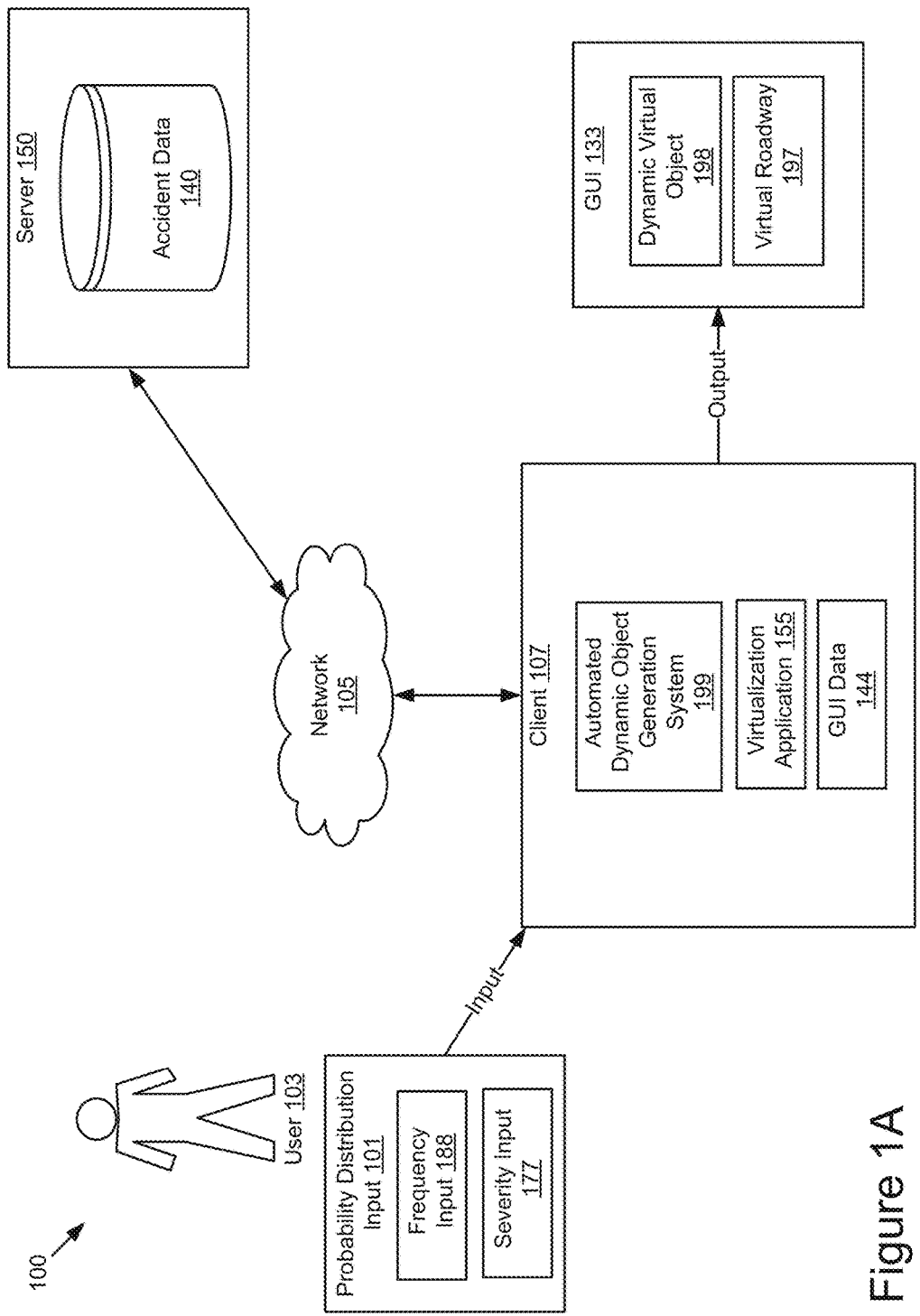
FIG. 1A is a block diagram illustrating an example operating environment for an automated dynamic object generation system.

Roadway virtualization software exist in the marketplace. Roadway virtualization software is a software package that predicts the performance of vehicles in response to driver controls (steering, throttle, brakes, clutch and shifting) in a simulation. It may also be used to test the performance of a vehicle design. An example of such software includes CarSim and Prescan, among others.

Vehicles are designed by vehicle design engineers. These vehicle designs include hardware elements and software elements. The performance of these hardware elements and software elements should be tested in a simulation prior to deploying the vehicle design as a vehicle in the real world. Roadway virtualization software allows vehicle design engineers to design a simulation where their vehicle designs may be tested in a simulation before they are deployed in the real world.

Automated vehicles include software that controls the driving functions of the vehicle. For example, the software may control how the automated vehicle response to objects in the environment that may behave in an erroneous behavior. An erroneous behavior may include any behavior that may cause or contribute to the occurrence of a roadway accident. The software included in the automated vehicle must identify and respond to these instances of erroneous behavior so that roadway accidents are minimized in occurrence and severity.

Virtualization software may test the performance of software included in an autonomous vehicle. For example, the simulation may include one or more virtual dynamic objects that sometimes behave erroneously in the simulation. Examples of virtual dynamic objects may include one or more of the following (including any similar or related objects): a vehicle; a pedestrian; an animal or some other object in the roadway; traffic lights that may sometimes malfunction; variable roadway surface friction (e.g., the roadway surface may be slippery, icy, dry, sandy, etc.); and variable visibility conditions (e.g., there may be fog, snow, ice, darkness or some other condition that affects visibility).

To utilize the roadway virtualization software, currently a vehicle design engineer must design a number of virtual dynamic objects to be included in the simulation. This process includes at least two example problems.

The first example problem is that the vehicle design engineer must provide dozens, hundreds or thousands of different user inputs to the roadway virtualization software in order to model the structure or physical properties of the dynamic virtual objects, the number of times these dynamic virtual objects occur within the simulation and the behavior of these dynamic virtual objects within the simulation. This process may take days or weeks to complete.

The second example problem is that once completed, there is no guarantee that the dynamic virtual objects created by the vehicle design engineer will be realistic relative to the real world since the vehicle design engineer may not have the requisite expertise to create realistic dynamic virtual objects. Indeed, research and experience has shown that the virtual dynamic objects generated by vehicle design engineers are frequently uninformed and incorrect since, although vehicle design engineer may be very skilled at designing vehicles, they may not have any experience in designing simulations that include realistic dynamic virtual objects that are representative of real world roadway conditions and have no knowledge about the qualities or attributes of a "realistic" virtual objects or "realistic" erroneous behavior for these objects.

The disclosure describes example implementations of an automated dynamic object generation system that solves both of these problems.

For the first problem, the automated dynamic object generation system may beneficially improve the performance of the roadway virtualization software by creating one or more dynamic virtual objects for inclusion in the simulation provided by the roadway virtualization software based on a single user input (e.g., the probability distribution input which specifies both (1) how frequently the dynamic virtual objects should behave erroneously and (2) how severe their behavior should be) or individual inputs that define (1) the frequency and (2) the severity.

For the second problem, the automated dynamic object generation system may beneficially improve the performance of the roadway virtualization software by creating the one or more dynamic virtual objects for inclusion in the simulation provided by the virtualization application based on object data and behavior data extracted from a database that describes real world roadway accidents including objects whose behavior caused or contributed to the occurrence of the roadway accidents (e.g., the National Highway and Traffic Safety Administration database described below). The object data describes the structure and physical properties of an object that caused or contributed to an occurrence of a roadway accident described by the database. The behavior data describes the behavior of the object that caused or contributed to the occurrence of the roadway accident (e.g., the "critical reason" or last event in the chain of events that culminates in the roadway accident). Since the dynamic virtual objects represent the objects included in the accident data and behave in a same or similar manner as the objects included in the accident data, the dynamic virtual objects generated by the automated dynamic object generation system are guaranteed to be realistic.

The automated dynamic object generation system may provide data that describes the dynamic virtual objects and their behavior to the roadway virtualization software. In some implementations, the automated dynamic object generation system may include a plug-in installed in the roadway virtualization software that improves the performance of the virtualization software by creating realistic examples of dynamic virtual objects for inclusion in the simulation provided by the roadway virtualization software.

Example Accident Data

The National Highway and Traffic Safety Administration ("NHTSA") sampled 5,740 roadway accidents from an estimated 2,189,000 roadway accidents nationwide in the United States from 2005 to 2007. Local media reports were used to obtain information regarding pre-crash scenarios. The NHTSA created a database that describes the accident data they collected. This database was researched by the NHTSA. The conclusion of this research was that the critical reason for most roadway accidents is the last event that precedes the chain of events that results in an occurrence of a roadway accident.

The database created by the NHTSA based on this research includes the following information for the roadway accidents included in the database: the data; the location; the names of the people involved; links to media articles describing the roadway accidents. The media articles provide accident reports that describe, among other things, pre-crash scenarios that are thought to have contributed to the occurrence of the roadway accidents. The NHTSA further scraped and filtered 3,846 of the accident reports based on the titles of the articles to identify unusual circumstances related to the roadway accidents.

The following are some examples of the data included in the NHTSA database: (1) "Woman jumps curb, hits female pedestrian, lands vehicle inside of local café on Highway 50 in Logan, Utah"; (2) "18-wheeler driver Justin Dowers, 33, killed, and Erica Myers, 44, injured after truck crosses into oncoming traffic, sideswipes a vehicle, collides head-on with another on Highway 89 in South Royalton, Vermont"; and (3) Motorcyclist crashes while trying to avoid deer on Occidental Road near Fort Dicks Road outside of Salina Calif." The examples provided here have been anonymized in consideration of the victims and their families. The actual NHTSA database is not anonymized.

The NHTSA categorized the critical reasons for most of the roadway accidents into the following categories: (1) erroneous driver behavior; (2) erroneous vehicle behavior; (3) erroneous environment behavior; and (4) unknown. Driver error was found to account for 94% of the studied roadway accidents, plus or minus 2.2%. Vehicle error was found to account for 2% of the studied roadway accidents, plus or minus 0.7%. Environmental errors such as poor visibility or unfavorable roadway surface friction were found to account for 2% of the studied roadway accidents, plus or minus 1.3%. Lastly, 2% of the roadway accidents had an unknown critical reason, plus or minus 1.4%.

For roadway accidents caused by erroneous driver behavior, the following statistics were found: 41% (plus or minus 2.2%) were the result of driver recognition errors (e.g., failing to see a stop sign, being intoxicated); 33% (plus or minus 3.7%) were the result of driver decision errors (e.g., failing to stop for a yellow traffic signal light, driver fatigue); 11% (plus or minus 2.7%) were the result of performance errors (e.g., the driver has poor driving skills, being an inexperienced driver, driver is distracted by internal or external conditions such as personal anxiety or focusing on their phone or radio); 7% (plus or minus 1.0%) were the result of non-performance errors (e.g., the driver made a false assumption, such as incorrectly assuming the behavior of another vehicle); and 8% (plus or minus 1.9%) were the result of other errors.

For roadway accidents caused by erroneous vehicle behavior, the following statistics were found: 35% (plus or minus 11.4%) were the result of tire or wheel failures (e.g., tire blowout); 22% (plus or minus 15.4%) were the result of a brake failure (e.g., insufficient brake fluid); 3% (plus or minus 3.3%) were the result of steering/suspension/transmission/engine-related failures (e.g., loss of power); and 40% (plus or minus 24.0%) were the result of other or unknown errors.

For roadway accidents caused by erroneous environmental behavior, the following statistics were found: 50% (plus or minus 14.5%) were the result of slick roads (e.g., vehicle loses control on icy roads, vehicle hydroplanes); 17% (plus or minus 16.7%) were the result of glare (e.g., sun reflects off a surface into the driver's eyes to cause poor visibility); 11% (plus or minus 7.2%) were the result of view objection (e.g., the driver cannot view the roadway property because of roadway construction); 9% (plus or minus 9.9%) were the result of other roadway related errors; 4% (plus or minus 2.9%) were the result of fog/rain/snow; 4% (plus or minus 9.1%) were the result of defective signs or traffic signals (e.g., a defective or incorrect roadway sign); and 1% (plus or minus 3.3%) were the result of poor roadway design.

The NHTSA database is one example source of accident data 140 as described herein. Accident data 140 may generally include any data that describes roadway accidents and quantitative data such as a behavior that caused the accident. Quantitative data may also include other data that is similar in type as described above for the NHTSA database.

Other example sources of accident data 140 may include one or more of the following: articles from newspapers; electronic news reports; police reports (e.g., some jurisdictions make police reports electronically available via a network); insurance claim data (e.g., if a person has an accident and files a claim with their automobile insurance provider, then the insurance provider will have "claim data" that describes the insured person's description of the accident and, optionally, the findings of the insurance provider's investigator who investigates each claim filed with the insurance company); a proprietary database such as the Nexis database managed by LexisNexis and includes electronically available news reports or police reports; the United Nations Economic Commission for Europe ("UNECE") maintains a UNECE statistical database that describes roadway accidents in Europe and may be a source of accident data similar to the NHTSA database; the United Kingdom maintains a Road Safety Database built using the STATS19 accident reporting form that may be a source of accident data 140 describing roadway accidents in the United Kingdom; and the International Traffic Safety Data and Analysis Group maintains an "IRTAD" database that may be a source of accident data 140.

In some implementations, accident data 140 from one or more of these sources may describe the same accident and the quantitative data from these multiple sources may be combined to build sufficient quantitative data to be equivalent to the NHTSA database or the overlap in similar description of the accident data may provide a confidence factor that the accident data 140 is accurate.

In some implementations, the accident data 140 described herein may be sourced from any data source or combination of data sources that includes sufficient quantitative data to be similar or equal to the detail provided by the NHTSA database.

In some implementations, the accident data 140 may be sourced from any data source that includes quantitative data describing the erroneous behavior of an object in the real world that contributed to the roadway accident occurring in the real world In some implementations, accident data 140 from one or more of these sources may be used to determine whether the dynamic virtual objects described herein are presented in a simulation in a realistic way and with a realistic frequency that accurately simulates a realistic scenario. A more realistic scenario may beneficially provide a more reliable simulation or more trustworthy test results.

Dynamic Objects

There are two main categories of dynamic objects present in all roadway accidents: (1) quasi-static road conditions; and (2) dynamic obstacles.

Quasi-static road conditions are changes that occur in road conditions over time. These changes that occur over time may cause unexpected vehicle behavior or additional dynamic obstacles. Examples of quasi-static road conditions may be categorized into the following categories: ground conditions; view obstruction; and degrading fixtures.

Examples of ground conditions include one or more of the following: spills; ditches; icy surfaces; fire; and sinkholes. Examples of view obstructions include one or more of the following: adverse weather; excessive glare; broken or missing traffic control devices; and poor road design. Examples of degrading fixtures include one or more of the following: a fallen tree; extended guard rails/curbs; and fallen signage.

Dynamic obstacles are physical objects that cause a possible collision. The goal of the autonomous software included in an autonomous vehicle is to avoid or minimize the impact with dynamic obstacles. Examples of dynamic obstacles may be categorized into the following categories: passive obstacles; and active obstacles.

Examples of passive obstacles include one or more of the following: deer; people; homeless encampments; broken tire; stalled vehicles; live animals; and broken fenders or other vehicle parts on the roadway. Examples of active obstacles include one or more of the following: vehicles driven by drunk drivers; flying objects; mopeds or bicycles; horse-drawn buggies; garbage trucks; armored trucks; double-decker buses; logging trucks; and tractor trailer trucks.

The automated dynamic object generation system may be operable to analyze the accident data using the framework described above when generating data describing the dynamic virtual objects and the behavior of the dynamic virtual objects. The automated dynamic object generation system may generate one or more error models that describe the behavior of the one or more dynamic virtual objects based on the above-described framework (see, e.g., FIG. 5). In this way, the automated dynamic object generation system may generate dynamic virtual objects for the simulation that are realistic examples of real world dynamic objects that may cause or contribute to the occurrence (or possible occurrence) of a roadway accident.

Random Variables

As described above, the automated dynamic object generation system may generate an error model that controls the behavior of the dynamic virtual objects inside the simulation. The automated dynamic object generation system may include functionality to introduce randomness into the behavior of these dynamic virtual objects and the structure or physical properties of these dynamic virtual objects. For example, the behavior data included in the error model may include bits that control one or more random variables associated with an object.

The random variables may include one or more of the following: the size of the dynamic virtual object; the path of the dynamic virtual object (e.g., as a vector including both position and velocity); the mass properties of the dynamic virtual object (e.g., the mass, the moment of inertia, the material, etc.).

The random variables may be extracted from the accident data by the automated dynamic object generation system as a component of the behavior data.

Example System Overview

FIG. 1A illustrates a block diagram of one embodiment of an environment 100 for an automated dynamic object generation system 199. The environment 100 includes a client 107 and a server 150. In the illustrated embodiment, these entities of the environment 100 may be communicatively coupled via a network 105. The client 107 may be operated by a user 103. The user 103 may provide a probability distribution input 101 in some implementations. In other implementations, the user may provide one or more user inputs. The client 107 may provide a graphical user interface ("GUI") 133 as an output responsive to the probability distribution input 101.

The server 150 and the client 107 can be used by way of example. While FIG. 1A illustrates one server 150 and one client 107, the disclosure applies to a system architecture having one or more servers 150 and one or more clients 107. Furthermore, although FIG. 1A illustrates one network 105 coupled to server 150 and the client 107, in practice one or more networks 105 can be connected to these entities. While FIG. 1A includes one automated dynamic object generation system 199 included in the client 107, the environment 100 could include one or more automated dynamic object generation system 199 included in one client 107 or across more than one client 107.

The network 105 can be a conventional type, wired or wireless, and may have numerous different configurations including a star configuration, token ring configuration, or other configurations. Furthermore, the network 105 may include a local area network (LAN), a wide area network (WAN) (e.g., the Internet), or other interconnected data paths across which multiple devices may communicate. In some implementations, the network 105 may be a peer-to-peer network. The network 105 may also be coupled to or include portions of a telecommunications network for sending data in a variety of different communication protocols. In some implementations, the network 105 includes Bluetooth® communication networks or a cellular communications network for sending and receiving data via short messaging service (SMS), multimedia messaging service (MMS), hypertext transfer protocol (HTTP), direct data connection, WAP, e-mail, etc. The network 105 may be a mobile data network such as 3G, 4G, LTE, Voice-over-LTE ("VoLTE"), or any other mobile data network or combination of mobile data networks.

The server 150 can be a hardware server that includes a processor, a memory and network communication capabilities. The server 150 may be communicatively coupled to the network 105.

The server 150 may include accident data 140. The accident data 140 may describe a plurality of roadway accident that occurred in the real world. For example, a government agency or some other group of people (or a single person) may collect data that describes roadway accidents in the real world. A roadway accident may include any accident that occurs on or near a roadway. For example, a roadway accident may include a crash involving one or more vehicles, an accident involving a pedestrian, an accident involving an animal or object on the roadway, an accident due to weather conditions, etc.

In some implementations, the accident data 140 may include a National Highway and Traffic Safety Administration database. A National Highway and Traffic Safety Administration database may include a database including data describing roadway accidents that is built and maintained by the National Highway and Traffic Safety Administration. In some implementations, a National Highway and Traffic Safety Administration database may include any data that is certified or indicated as authentic or accurate by the National Highway and Traffic Safety Administration.

For each accident it describes, the accident data 140 may describe one or more objects and one or more variables that caused the accident or contributed to the accident occurring.

For example, assume that the accident data 140 describes an accident that includes a first vehicle swerving from a south-bound lane into oncoming traffic in the north-bound lane to collide one or more second vehicles. In this example, the first vehicle is an object. The first vehicle swerving into oncoming traffic is a variable that caused the accident. Further assume that the first vehicle swerved into oncoming traffic because one of its tires burst. The tire bursting is a variable that contributed to the occurrence of the accident. Further assume that a second vehicle that was struck by the first vehicle had faulty brakes that contributed to the second vehicle's inability to avoid a collision with the first vehicle. The faulty brakes of the second vehicle are yet another variable that contributed to the occurrence of the accident.

The accident data 140 may describe an accident caused by weather. For example, assume that the accident data 140 describes an accident that involves a vehicle driving in foggy weather conditions and striking a guard rail. In this example, the fog may be an object. The density of the fog being too dense to for a human to see through may be a variable that contributed to the occurrence of the accident. If the time of day was at night or dusk, then the darkness of the driving environment may be yet another variable that contributed to the occurrence of the accident.

The server 150 may transmit the accident data 140 to the client 107 via the network 105. The client 107 may store the accident data 140 in a non-transitory memory that is included in the client 107 or accessible by the client 107.

The client 107 may include a processor-based computing device. For example, the client 107 may include one or more of the following: a personal computer; a special-purpose computing device; a laptop; a tablet computer; a smartphone; a set-top box; a smart television; wearable device; etc. The client 107 may be communicatively coupled to the network 105. The client 107 may include conventional peripherals for receiving one or more inputs and providing one or more outputs. For example, the client 107 may include a monitor for displaying the GUI 133.

The client 107 may include one or more of the following: an automated dynamic object generation system 199; a virtualization application 155; and GUI data 144.

The virtualization application 155 may include roadway virtualization software. The GUI data 144 may include data that describes a simulation provided by the virtualization application 155. The GUI data 144 may include graphical data that causes a monitor or some other display peripheral to display the GUI 133. The GUI 133 may include a graphical display output depicting the simulation provided by the virtualization application 155.

In some implementations, the simulation provided by the virtualization application 155 may be operable to test the performance of a virtual vehicle built based on a vehicle design for a real world vehicle. The vehicle design may include a design for a conventional vehicle, an autonomous vehicle or a semi-autonomous vehicle. In this way, the simulation provided by the virtualization application 155 may test the performance of a virtual vehicle that represents a real world vehicle.

In some implementations, the vehicle design may be a candidate design for a vehicle that has not been sold to the public. The simulation provided by the virtualization application 155 may test the performance of a virtual vehicle built based on the vehicle design to ensure that a real world vehicle built based on the vehicle design meets the requirements of the vehicle design, a design engineer who built the vehicle design, a manufacturer of the real world vehicle, a government regulation applicable to the real world vehicle, a standard applicable to the real world vehicle, etc.

The automated dynamic object generation system 199 may include code and routines that are operable to analyze the accident data 140 and generate one or more dynamic virtual objects 198 based on the accident data 140. The dynamic virtual objects 198 may be included in the simulation to test the performance of the virtual vehicle.

In some implementations, the dynamic virtual objects 198 generated by the automated dynamic object generation system 199 represent objects that are extracted from the accident data 140. For example, if the accident data describes an object as a vehicle swerving into oncoming traffic, then one of the dynamic virtual objects 198 included in the simulation may be a virtual vehicle swerving into oncoming traffic. The behavior of the dynamic virtual object 198 in the simulation is operable to be similar or the same as the real world object that is represented by the dynamic virtual object 198.

The GUI 133 may include one or more moving images generated based at least in part on the GUI data 144. The GUI 133 may display the simulation. The simulation includes one or more graphical images that depict one or more of the following: a virtual vehicle; a virtual roadway 197; and the one or more dynamic virtual objects 198. The virtual roadway 197 may include a virtual representation of a roadway in the simulation. A virtual vehicle may drive on the virtual roadway 197 during the simulation. The one or more dynamic virtual objects 198 may provide obstacles or challenges for the virtual vehicle. For example, the one or more dynamic virtual objects 198 may include one or more of the following: a swerving vehicle; a poor visibility weather condition such as fog, rain, snow, ice, darkness, etc.; a pedestrian that is jay walking in the path of the virtual vehicle, an animal in the path of the virtual vehicle; an object in the path of the virtual vehicle; a virtual vehicle or some other object whose behavior in the simulation would be a violation of a law or regulation in the real world; a virtual vehicle or some other object whose behavior in the simulation would be negligent or reckless in the real world, etc. The one or more dynamic virtual objects 198 represent objects present in the accident data 140. The one or more dynamic virtual objects 198 behave in the simulation in a manner that is the same or similar to how the represented objects behaved in the accidents described by the accident data 140. In this way, the one or more dynamic virtual objects 198 test how the automated vehicle would perform in avoiding accidents like those described by the accident data 140.

The simulation displayed by the GUI 133 may test how the virtual vehicle responds to a dynamic virtual object 198 in various conditions or settings. For example, the vehicle design included in the simulation may be a design for an automated vehicle. The virtualization application 155 may generate the virtual vehicle that represents the automated vehicle based on a vehicle model that describes the physical hardware of the vehicle and a software model that describes the software of the vehicle. The software model includes the software that controls how the automated vehicle would respond to one or more obstacles or challenges. The virtual vehicle may respond to the virtual obstacles or challenges in the simulation in a manner that is the same or similar to how the automated vehicle would respond to real world-versions of these obstacles or challenges in the real world. For example, the simulation may include moving images that are displayed on the GUI 133. The GUI 133 may include a virtual roadway 197. A virtual vehicle representing the automated vehicle may drive on the virtual roadway 197 during the simulation. The virtual roadway 197 may include one or more dynamic virtual objects 198 (e.g., swerving vehicles, poor visibility weather conditions, pedestrians that are jay walking in the path of the virtual vehicle, animals or objects in the path of the vehicle, etc.). The virtual vehicle will respond to the one or more dynamic virtual objects 198 in the simulation in a manner that is the same or similar to how the automated vehicle would respond to real world-versions of these obstacles or challenges in the real world.

In some implementations, the automated dynamic object generation system 199 may be a plug-in for the virtualization application 155.

In some implementations, the automated dynamic object generation system 199 may be operable to improve the performance of a computer including the virtualization application 155. For example, assume the user 103 is a design engineer that would like to use the virtualization application 155 to test the performance of a vehicle design they have created. Ordinarily, the user 103 would be required to manually create dozens or hundreds of dynamic virtual objects 198 for inclusion in the simulation to test the performance of their vehicle design. This process includes at least two example problems.

The first example problem is that the user 103 would be required to provide dozens, hundreds or thousands of different user inputs to the virtualization application 155 in order to model the structure or physical properties of the dynamic virtual objects 198, the number of times these dynamic virtual objects 198 occur within the simulation and the behavior of these dynamic virtual objects 198 within the simulation. This process may take days or weeks to complete.

The second example problem is that once completed, there is no guarantee that the dynamic virtual objects 198 created by the user 103 will be realistic relative to the real world since the user 103 may not have the requisite expertise to create realistic dynamic virtual objects.

The automated dynamic object generation system 199 solves both of these problems.

For the first problem, the automated dynamic object generation system 199 may beneficially improve the performance of the virtualization application 155 by creating one or more dynamic virtual objects 198 for inclusion in the simulation provided by the virtualization application 155 based on a single user input (e.g., the probability distribution input 101 which specifies both the frequency input 188 and the severity input 177) or one or more user inputs (e.g., one or more of the frequency input 188 or the severity input 177). For example, the user 103 is a vehicle design engineer that has created a vehicle design that they would like to test using the virtualization application 155. The client 107 includes a non-transitory memory that stores the accident data 140. The automated dynamic object generation system 199 may extract object data that describes one or more objects from the accident data 140 and behavior data that describes the erroneous behavior of these one or more objects that caused or contributed to the roadway accident. The automated dynamic object generation system 199 may create an error model that describes these objects and the behavior of these objects based on (1) the object data extracted from the accident data 140, (2) the behavior data extracted from the accident data 140 and (3) a probability distribution input 101 provided by the user 103. The error model may be described by the error model data 264 described below with reference to FIG. 2. The automated dynamic object generation system 199 may generate one or more dynamic virtual objects 198 based on the error model.

The automated dynamic object generation system 199 may generate GUI data 144 for displaying the one or more dynamic virtual objects 198 in the simulation. In this way, the automated dynamic object generation system 199 may generate one or more dynamic virtual objects 198 for inclusion the simulation based on a single probability distribution input 101 provided by the user 103.

The probability distribution input 101 may specify a frequency input 188 and a severity input 177.

The frequency input 188 may specify how frequently a particular object described by the object data should behave erroneously in the simulation. For example, the virtual dynamic object may appear in the simulation for periods of time and not behave as described by the behavior data, while during other periods of time the virtual dynamic object may beave erroneously as described by the behavior data.

The severity input 177 may specify how severe the behavior of the dynamic virtual object 198 should be within the simulation. For example, for each object included in the accident data 140, the accident data 140 may include behavior data that describes the behavior of the object and a bit that describes the severity of the behavior of the object on a scale or one to ten (or some other construct that specifies a range of severity of behavior). The accident data 140 may include numerous instances of similar objects behaving in similar ways but with varying degrees of severity (e.g., a vehicle swerving into oncoming traffic but traveling five miles per hour may be a "three" on the severity scale but a vehicle swerving into oncoming traffic but traveling seventy miles per hour may be a "ten" on the severity scale). The severity input 177 may cause the automated dynamic object generation system 199 to analyze the accident data 140 and select a set of objects from the accident data 140 whose behavior severity corresponds to the severity input 177 provided by the user. The automated dynamic object generation system 199 may generate the error model so that the dynamic virtual objects 198 generated based on the error model behave with a severity that corresponds to the severity input 177 (or a range of severities that correspond to the probability distribution that includes the severity input 177).

For the second problem, the automated dynamic object generation system 199 may beneficially improve the performance of the virtualization application 155 by creating the one or more dynamic virtual objects 198 for inclusion in the simulation provided by the virtualization application 155 based on the accident data 140. The accident data 140 describes real world roadway accidents including objects whose behavior caused or contributed to the occurrence of the roadway accidents. Since the dynamic virtual objects 198 represent the objects included in the accident data 140 and behave in a same or similar manner as the objects included in the accident data 140, the dynamic virtual objects 198 generated by the automated dynamic object generation system 199 are guaranteed to be realistic.

The user 103 is a human user of the client 107. The user 103 may be a vehicle design engineer or some other human user. The user 103 provides the probability distribution input 101 to the automated dynamic object generation system 199 or some other user input to the automated dynamic object generation system 199. The user input may be provided via one or more sliders or graphical fields of a GUI that enable the user 103 to specify the probability distribution input 101 (or the frequency input 188 and the severity input 177 individually).

The probability distribution input 101 may include data that the frequency input 188 and the severity input 177 as a table or function.

In some implementations, the automated dynamic object generation system 199 may include an electronic device configured to perform one or more steps of the method 300 described below with reference to FIGS. 3A and 3B.

In some implementations, the automated dynamic object generation system 199 can be implemented using hardware including a field-programmable gate array ("FPGA") or an application-specific integrated circuit ("ASIC"). In some other implementations, the automated dynamic object generation system 199 can be implemented using a combination of hardware and software. The automated dynamic object generation system 199 may be stored in a combination of the devices and servers, or in one of the devices or servers. The automated dynamic object generation system 199 may include code and routines configured to perform one or more steps of the method 300 described below with reference to FIGS. 3A and 3B when executed by a processor, such as processor 225, described below with reference to FIG. 2.

The automated dynamic object generation system 199 will be described in more detail below with reference to FIGS. 1B, 2 and 4.

Figure 1B:
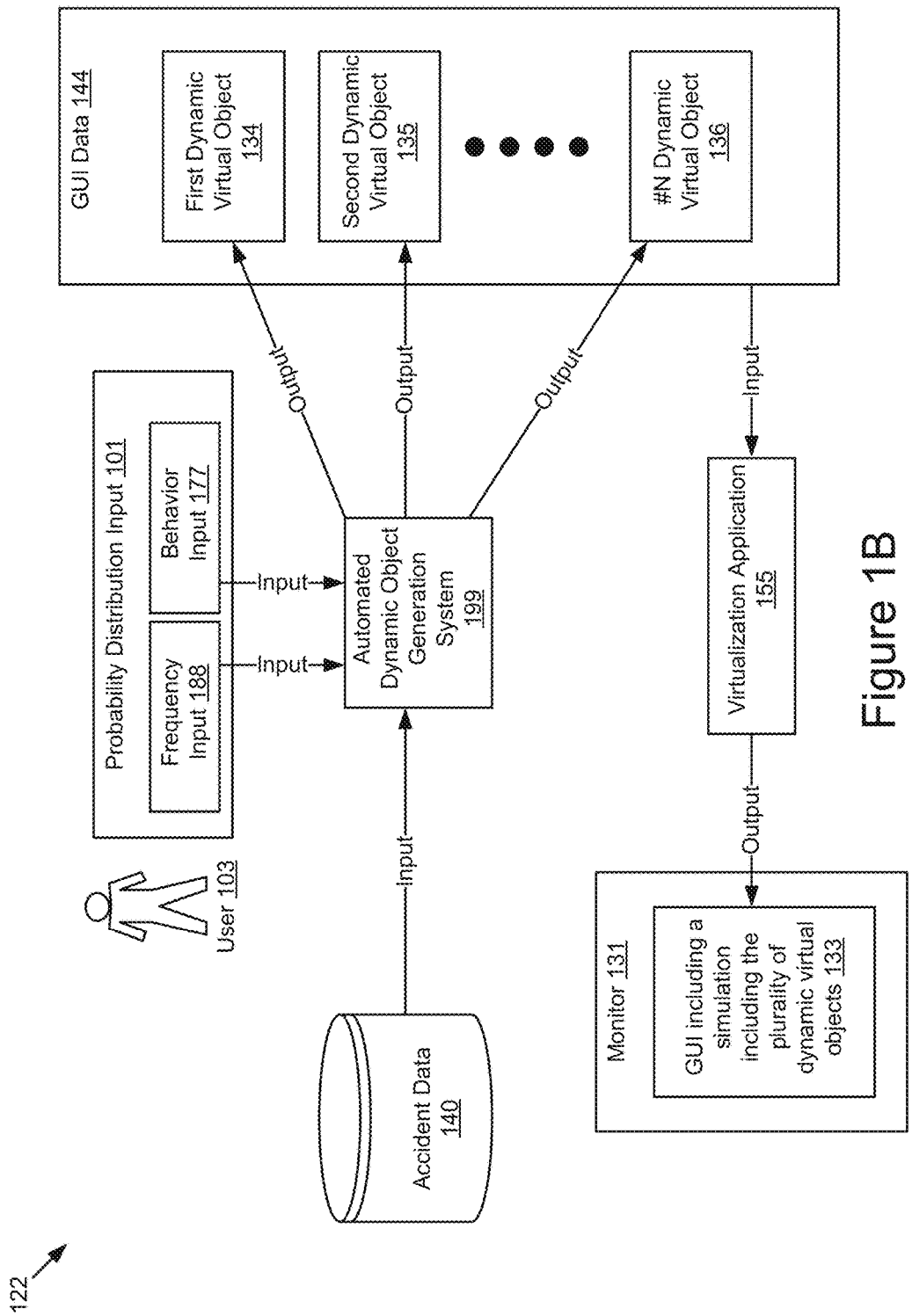
FIG. 1B is a block diagram illustrating an example process flow for the automated dynamic object generation system.

Referring now to FIG. 1B, depicted is a block diagram illustrating an example process flow 122 for an automated dynamic object generation system 199.

The automated dynamic object generation system 199 may receive the accident data 140 as an input. Optionally, the accident data 140 may be coded in the automated dynamic object generation system 199 at design time.

The automated dynamic object generation system 199 may receive a frequency input 188 and a severity input 177. The frequency input 188 and the severity input 177 may be included in a single user input, e.g., the probability distribution input 101. The user 103 may provide the frequency input 188 and the severity input 177.

The automated dynamic object generation system 199 outputs a set of GUI data 144. The GUI data 144 may include graphical data for causing a monitor 131 or some other peripheral to display a GUI such as GUI 133.

The GUI data 144 may include graphical data for displaying a plurality of dynamic virtual objects. The plurality of dynamic virtual objects 134, 135, 136 may include any positive whole number dynamic virtual objects (i.e., 1 to N). For example, the plurality may include a first dynamic virtual object 134, a second dynamic virtual object 134 and a #N dynamic virtual object 136 (referred to individually as "dynamic virtual object 198" or collectively as "the plurality of dynamic virtual objects 134, 135, 136").

In some embodiments, the plurality of dynamic virtual objects 134, 135, 136 may be generated by the automated dynamic object generation system 199 based at least in part on the frequency input 188, the severity input 177 and at least a portion of the accident data 140.

The GUI data 144 may be provided as an input to the virtualization application 155. The virtualization application 155 may include a vehicle model for generating a virtual vehicle and a roadway model for generating a virtual roadway system. The virtualization application 155 may output a GUI 133 to a monitor 131 that graphically depicts a simulation including the plurality of dynamic virtual objects 134, 135, 136.

Example Electronic Devices

Figure 2:
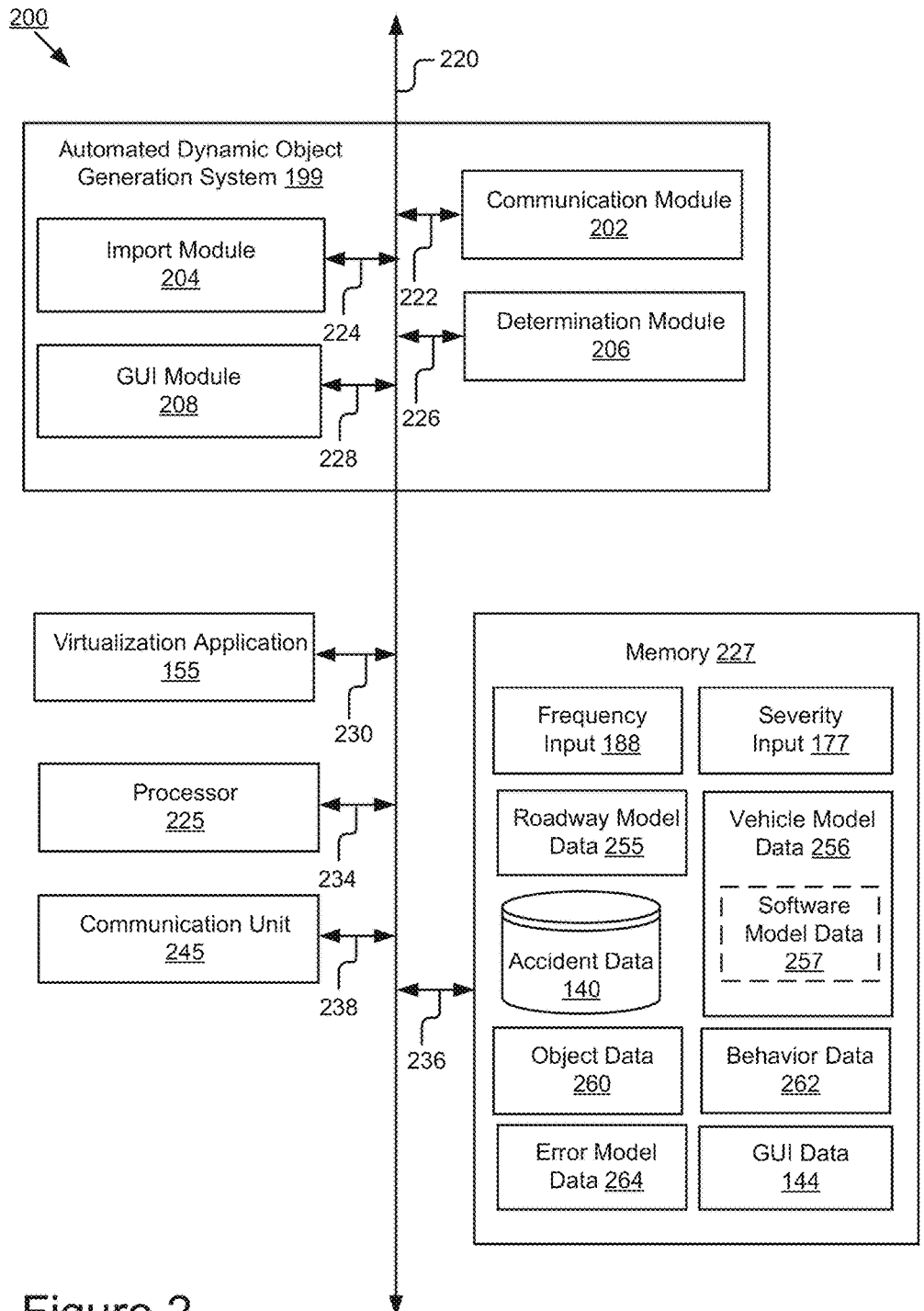
FIG. 2 is a block diagram illustrating an example computer system including the automated dynamic object generation system.

FIG. 2 is a block diagram illustrating an example computer system 200 including an example of the automated dynamic object generation system 199. In some implementations, the automated dynamic object generation system 199 may include an electronic device programmed or configured to perform one or more blocks of the method 300 described below with reference to FIGS. 3A and 3B. The automated dynamic object generation system 199 may be an element of one or more of the client 107 or the server 150.

In some implementations, the automated dynamic object generation system 199 may include a special-purpose computing device configured to provide some or all of the functionality described above with reference to the automated dynamic object generation system 199 or below with reference to method 300 described below with reference to FIGS. 3A and 3B.

The computer system 200 may include the automated dynamic object generation system 199, a virtualization application 155, a processor 225, a memory 227 and a communication unit 245. The components of the computer system 200 are communicatively coupled by a bus 220. In some embodiments, the components of the computer system 200 are local to the same hardware so that the bus 220 is not necessary for communication among the components of the computer system 200. In some embodiments, communication structures or methods other than the bus 220 may be implemented.

The virtualization application 155 is communicatively coupled to the bus 220 via signal line 230. The processor 225 is communicatively coupled to the bus 220 via signal line 234. The memory 227 is communicatively coupled to the bus 220 via the signal line 236. The communication unit 245 is communicatively coupled to the bus 220 via signal line 238. In some embodiments, one or more of the elements of the automated dynamic object generation system 199 may share a signal line for communication with the bus 220.

The virtualization application 155 includes code and routines configured to generate a simulation for testing a virtual vehicle built based on the vehicle model data 256. The virtualization application 155 may include a roadway virtualization software.

In some implementations, the automated dynamic object generation system 199 is a plug-in included in the virtualization application 155.

In some implementations, the virtualization application 155 may be stored on the memory 227 and accessible by the processor 225 for execution so that the virtualization application 155 may provide its functionality.

The processor 225 includes an arithmetic logic unit, a microprocessor, a general-purpose controller, or some other processor array to perform computations and provide electronic display signals to a display device. The processor 225 processes data signals and may include various computing architectures including a complex instruction set computer (CISC) architecture, a reduced instruction set computer (RISC) architecture, or an architecture implementing a combination of instruction sets. Although FIG. 2 includes a single processor 225, multiple processors 225 may be included. The processor 225 may include a graphical processing unit. Other processors, operating systems, sensors, displays, and physical configurations may be possible.

The memory 227 is a tangible storage medium that stores instructions or data that may be accessed and executed by the processor 225. The instructions or data may include code for performing the techniques described herein. The memory 227 may include a dynamic random access memory (DRAM) device, a static random access memory (SRAM) device, flash memory, or some other memory device. In some implementations, the memory 227 also includes a non-volatile memory or similar permanent storage device and media including a hard disk drive, a floppy disk drive, a CD-ROM device, a DVD-ROM device, a DVD-RAM device, a DVD-RW device, a flash memory device, or some other mass storage device for storing information on a more permanent basis.

The memory 227 may include one or more of the following elements: the accident data 140; the frequency input 188; the severity input 177; roadway model data 255; vehicle model data 256; the accident data 140; object data 260; behavior data 262; error model data 264; and the GUI data 144. The following elements were described above with reference to FIG. 1A or 1B, and so, their descriptions will not be repeated here: the accident data 140; the frequency input 188; the severity input 177; the accident data 140; and the GUI data 144.

The roadway model data 255 may include data describing of one or more virtual roadway systems that are included in the simulation described by the GUI data 144. For example, the roadway model data 255 may include data that describes the structure and physical properties of the one or more virtual roadway systems.

The vehicle model data 256 may include data describing of one or more virtual vehicles that are included in the simulation described by the GUI data 144. For example, the vehicle model data 256 may include data that describes the structure and physical properties of the one or more virtual vehicles. The vehicle model data 256 may be based on a vehicle design for a real world vehicle or a vehicle that is proposed for creation in the real world. The vehicle model data 256 operable to cause the virtual vehicle to accurately represent vehicle design.

The vehicle model data 256 may include software model data 257. The software model data 257 may describe the properties and behaviors of software that is operable in the vehicle described by the vehicle design. The software model data 257 include software for an autonomous vehicle. The software model data 257 may be operable so that the virtual vehicle behaves in the simulation in a manner that is the same or similar to how a real world vehicle built based on the vehicle model data 256 and the software model data 257 would behave the real world under the same or similar conditions.

The object data 260 describes one or more objects that are extracted by the automated dynamic object generation system 199 from the accident data 140. The one or more objects described by the object data 260 may have been involved in a roadway accident described by the accident data 140 or contributed to an accident described by the accident data 140.

The behavior data 262 describes the behavior of the one or more objects extracted from the accident data 140 by the automated dynamic object generation system 199. The behavior data 262 may describe an erroneous behavior of the object in the real world. The erroneous behavior may include the behavior that contributed to the roadway accident occurring in the real world. For example, the erroneous behavior described by the behavior data 262 may include the "critical reason" for a roadway accident as described above. In another example, the erroneous behavior described by the behavior data 262 may include the last behavior in a chain of behaviors that culminated in the roadway accident. The behavior data 262 may be extracted from the accident data 140 by scraping an accident report described by the accident data 140 (or linked to by the accident data 140).

In some implementations, the behavior data 262 may include one or more random variables as described above. For example, the import module 204 may categorize the accident data 140 into different categories. A given category may include multiple accidents with similar "critical reasons" or similar "erroneous behavior." The import module 204 may identify similar roadway accidents based on a similar "critical reason" or "erroneous behavior" shared among the different roadway accidents. The import module 204 may identify a range of variables relating to the object described by the object data 260 that is associated with the behavior data 262. For example, the range of variables may include one or more of the following for each object: the size of the object; the path of the object (as defined by a vector including position and velocity); the mass properties of the object (mass, moment of inertia, material, etc.).

In some implementations, each object described by the object data 260 may be associated with a portion of the behavior data 262 that describes an erroneous behavior of that object that caused or contributed to the accident occurring in the real world (and, optionally, one or more random variables).

In some implementations, for each behavior of an object described by the behavior data 262, the behavior data 262 may include a severity value that describes the severity of the erroneous behavior of that object relative to other objects that behaved similarly. The severity value may be a positive whole number. For example, the severity value may include a positive whole number from one to ten (or some other scale). In this example, ten may be the most severe behavior and one may be the least severe behavior. The accident data 140 may have included the severity value for each behavior. For example, the accident data 140 is retrieved from a National Highway and Traffic Safety Administration database that includes the severity scores for each behavior of an object described by the database. An employee or agent of the National Highway and Traffic Safety Administration database may assign the severity score based on their knowledge or opinion.

The error model data 264 describes a model of one or more dynamic virtual objects 198 generated based on one or more of the following: the frequency input 188, the severity input 177, the object data 260 and the behavior data 262.

In some embodiments, the memory 227 stores any data necessary for the virtualization application 155 to provide its functionality.

The communication unit 245 may include hardware that transmits and receives data to and from the network 105. In some implementations, the communication unit 245 includes a port for direct physical connection to the network 105 or to another communication channel. For example, the communication unit 245 includes a USB, SD, CAT-5, or similar port for wired communication with the network 105. In some implementations, the communication unit 245 includes a wireless transceiver for exchanging data with the network 105 or other communication channels using one or more wireless communication methods, including IEEE 802.11, IEEE 802.16, Bluetooth®, or another suitable wireless communication method.

In some implementations, the communication unit 245 includes a cellular communications transceiver for sending and receiving data over a cellular communications network including via short messaging service (SMS), multimedia messaging service (MMS), hypertext transfer protocol (HTTP), direct data connection, WAP, e-mail, or another suitable type of electronic communication. In some implementations, the communication unit 245 includes a wired port and a wireless transceiver. The communication unit 245 also provides other conventional connections to the network 105 for distribution of files or media objects using standard network protocols including TCP/IP, HTTP, HTTPS, and SMTP, etc.

In some implementations, the automated dynamic object generation system 199 includes one or more of the following elements: a communication module 202; an import module 204; a determination module 206; and a GUI module 208.

The communication module 202 is communicatively coupled to the bus 220 via signal line 222. The import module 204 is communicatively coupled to the bus 220 via signal line 224. The determination module 206 is communicatively coupled to the bus 220 via signal line 226. The GUI module 208 is communicatively coupled to the bus 220 via signal line 228.

The communication module 202 may include code and routines configured to handle communications between the automated dynamic object generation system 199 and other components of the computer system 200. In some implementations, the communication module 202 can include a set of instructions executable by the processor 225 to provide the functionality described below for handling communications between the automated dynamic object generation system 199 and other components of the environment 100 described above with reference to FIG. 1. In some implementations, the communication module 202 can be stored in the memory 227 of the computer system 200 and can be accessible and executable by the processor 225.

The communication module 202 sends and receives data, via the communication unit 245, to and from the network 105. For example, the communication module 202 receives, via the communication unit 245, the accident data 140 from the network 105.

In some embodiments, the communication module 202 receives data from components of the automated dynamic object generation system 199 and stores the data in the memory 227. For example, the communication module 202 receives the object data 260 from the import module 204 and stores the object data 260 in the memory 227.

In some embodiments, the communication module 202 receives the frequency input 188 and the severity input 177 and stores them in the memory 227.

The import module 204 may include code and routines configured to import the accident data 140. The import module 204 may extract the object data 260 and the behavior data 262 from the accident data 140.

In some embodiments, the import module 204 analyses the accidents described included in the accident data 140 and assigns a severity value to the erroneous behavior of each object included in the accident data 140. For example, the realism system may estimate, for each object included in the accident data 140, how severe their behavior is relative to the erroneous behavior of other similar objects. The import module 204 may assign the severity value to the erroneous behavior of the object as described by the behavior data 262 based on the estimate. In some implementations, the accident data 140 includes data that describes the severity value and the behavior data 262 extracted from the accident data 140 by the import module 204 includes the severity value.

In some implementations, the import module 204 extracts random variables as described above for the behavior data 262 stored in the memory 227.

In some implementations, the import module 204 can be stored in the memory 227 of the computer system 200 and can be accessible and executable by the processor 225.

The determination module 206 may include code and routines configured to receive one or more the frequency input 188 and the severity input 177. The determination module 206 may associate the with frequency input 188 and the severity input 177 with the behavior data 262. For example, each object described by the object data 260 may be associated with a different portion of the behavior data 262 that describes the erroneous behavior of that object in the real world. The severity input 177 may describe how severe the erroneous behavior of the dynamic virtual objects generated by the automated dynamic object generation system 199 should be when they are executed in the simulation provided by the virtualization application 155. The determination module 206 may select combinations of objects and associated erroneous behaviors that have a severity value that matches (or substantially matches) the severity input 177. The frequency input 188 may describe how frequently these selected objects should appear in the simulation and behave erroneously as described behavior data 262. The determination module 206 may associate the frequency input 188 and the severity input 177 with the selected combinations of objects and behaviors that matched (or substantially matched) the severity input 177.

The determination module 206 may construct one or more error models for generating one or more dynamic virtual objects 198 based in part on the association between the frequency input 188, the severity input 177 and the behavior data 262. In some implementations, each object described by the object data 260 may be associated with a different error model and a different behavior in the behavior data 262.

The error models constructed by the determination module 206 may be described by the error model data 264.

In some embodiments, the determination module 206 can be stored in the memory 227 of the automated dynamic object generation system 199 and can be accessible and executable by the processor 225.

The GUI module 208 may generate graphical data for displaying the simulation on a monitor or some other display peripheral. The graphical data generated by the GUI module 208 may include the GUI data 144. For example, the GUI module 208 may generate GUI data 144 for displaying a simulation that includes the set of dynamic virtual objects 198. The graphical data causes a monitor depict the simulation that includes the set of dynamic virtual objects 198. The set of dynamic virtual objects 198 behave in the simulation in accordance with their associated error model. In this way, the simulation provided by the virtualization application 155 includes a set of dynamic virtual objects 198 that behave realistically is a way that is the same or similar to how objects behaved in real world roadway accidents described by the accident data 140.

In some embodiments, the GUI module 208 can be stored in the memory 227 of the computer system 200 and can be accessible and executable by the processor 225.

Example Methods

Figure 3A:
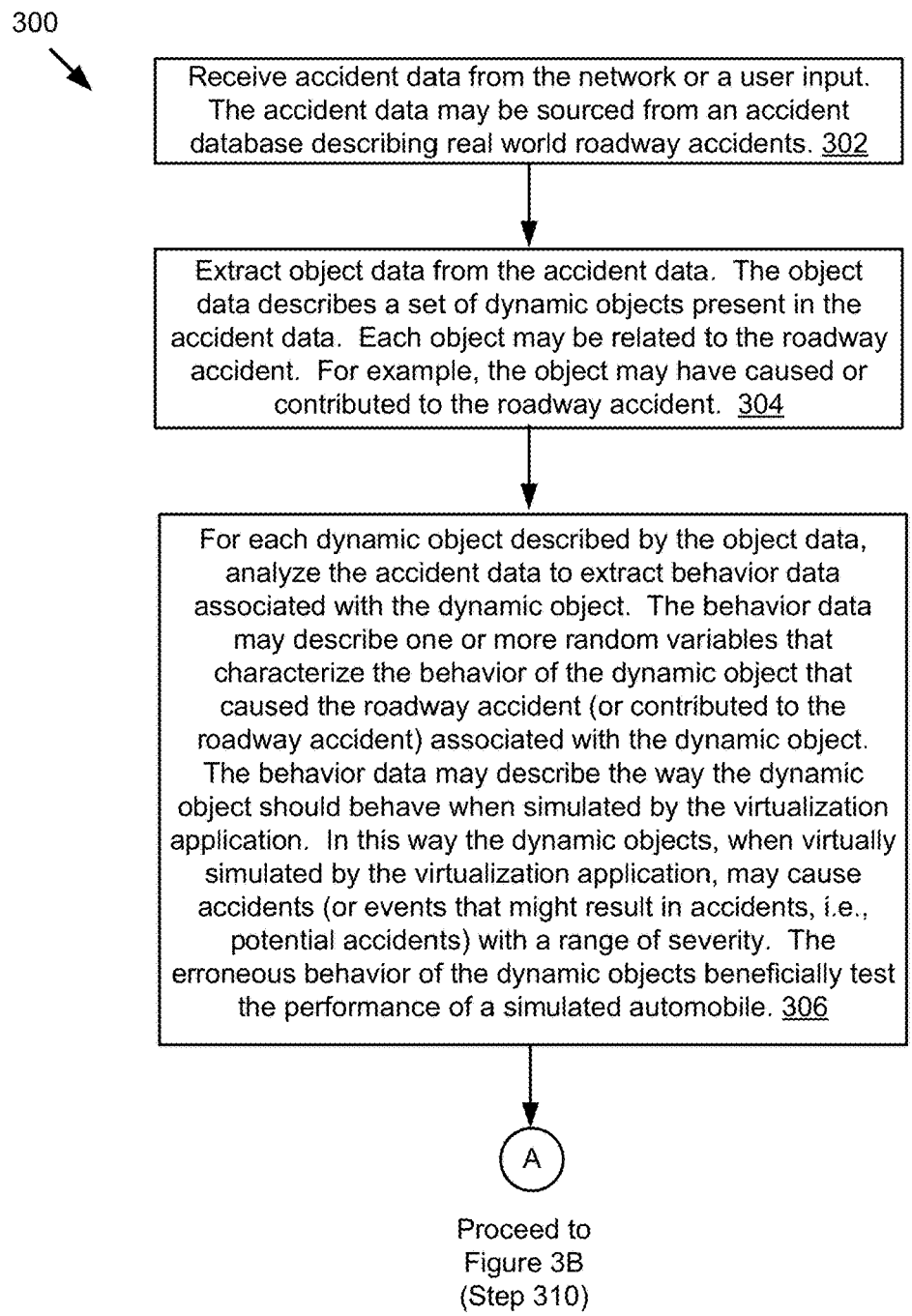
FIGS. 3A and 3B are a flowchart of an example method for generating a dynamic virtual object for including in a simulation for testing a vehicle design.
Figure 3B:
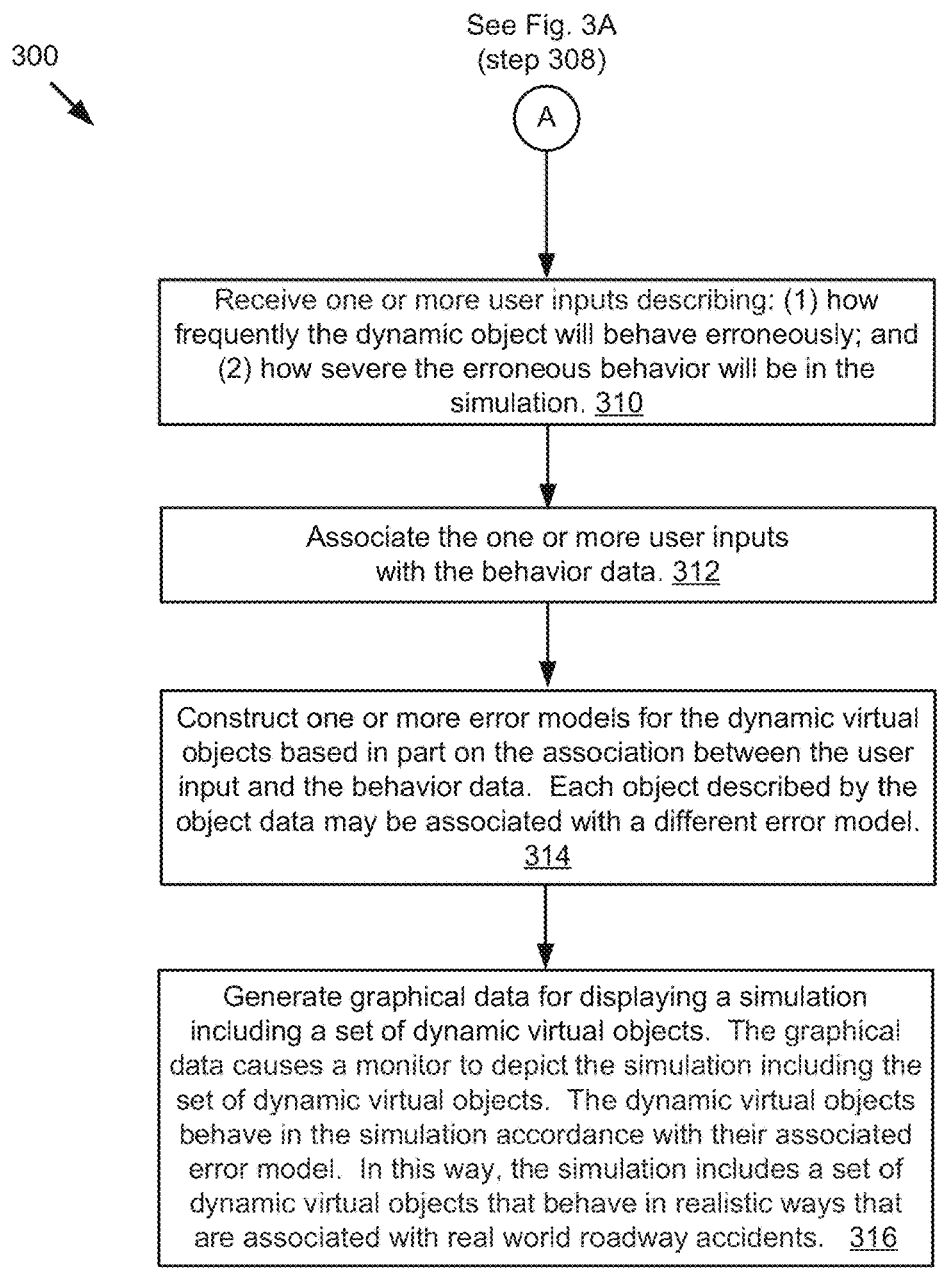

FIGS. 3A and 3B are a flowchart of an example method 300 for generating a dynamic virtual object for including in a simulation for testing a vehicle design.

At step 302 accident data is received from the network or a user input. The accident data may be sourced from an accident database describing real world roadway accidents.

At step 304 object data is extracted from the accident data. The object data describes a set of dynamic objects present in the accident data. Each object may be related to the roadway accident. For example, the object may have caused or contributed to the roadway accident.

At step 306, for each dynamic object described by the object data, the accident data is analyzed to extract behavior data associated with the dynamic object. The behavior data may describe one or more random variables that characterize the behavior of the dynamic object that caused the roadway accident (or contributed to the roadway accident) associated with the dynamic object.

In some implementations, the behavior data may describe the way the dynamic object should behave when simulated by the virtualization application. In this way the dynamic objects, when virtually simulated by the virtualization application, may cause accidents (or events that might result in accidents, i.e., potential accidents) with a range of severity. The erroneous behavior of the dynamic objects may beneficially test the performance of a simulated automobile.

Referring now to FIG. 3B, at step 310 ogle or more user inputs are received. The user inputs may describe one or more of the following: (1) how frequently the dynamic object will behave erroneously; and (2) how severe the erroneous behavior will be in the simulation.

At step 312 the one or more user inputs may be associated with the behavior data.

At step 314 one or more error models for the dynamic virtual objects may be constructed based in part on the association between the one or more user inputs and the behavior data. Each object described by the object data may be associated with a different error model (and different portions of the behavior data that describe the behavior of this particular object).

At step 316 graphical data for displaying a simulation including a set of dynamic virtual objects may be generated. The graphical data causes a monitor to depict the simulation including the set of dynamic virtual objects. The dynamic virtual objects behave in the simulation accordance with their associated model. In this way, the simulation includes a set of dynamic virtual objects that behave in realistic ways that are associated with real world roadway accidents.

Example Process Flow Diagrams

Figure 4:
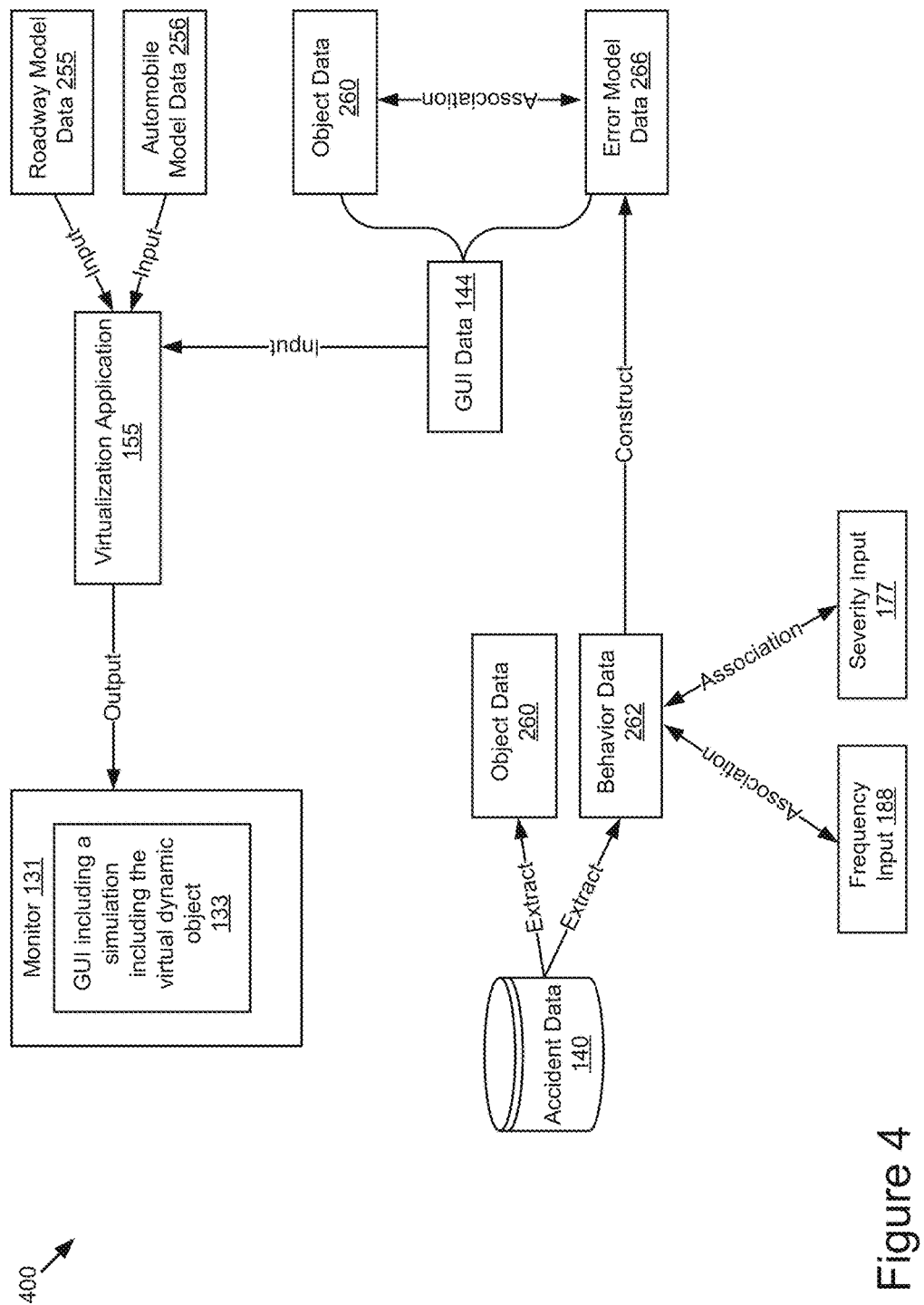
FIG. 4 is a block diagram illustrating an example process flow for the automated dynamic object generation system.

FIG. 4 is a block diagram illustrating an example process flow 400 for the automated dynamic object generation system 199.

Object data 260 and behavior data 262 may be extracted from the accident data 140 by the automated dynamic object generation system 199. A frequency input 188 and a severity input 177 may be associated with the behavior data 262.

For example, the object data 260 may describe a single object and the behavior data 262 may describe the erroneous behavior of this object that caused the accident or contributed to the accident occurring. The object data 260 may be associated with the behavior data 262 since the behavior data 262 describes the behavior of the object described by the object data 260. The frequency input 188 may describe how frequently the object should behave erroneously in the simulation. The severity input 177 may describe how sever the behavior of the object should be in the simulation. The frequency input 188 and the severity input 177 may be associated with the behavior data 262.

The behavior data 262 and its associated frequency input 188 and severity input 177 may be used by the automated dynamic object generation system 199 to construct the error model data 266 for the object described by the object data 260. The error model data 266 may be associated with the object data 260. In this way the automated dynamic object generation system 199 may generate a dynamic virtual object for inclusion in the simulation provided by the virtualization application 155. The automated dynamic object generation system 199 may generate the GUI data 144 for depicting the dynamic virtual object. The GUI data 144 may be inputted to the virtualization application 155 along with the roadway model data 255 and the vehicle model data 256. The virtualization application 155 may output a GUI 133 to a monitor 131 that depicts a simulation including the virtual dynamic object described by the error model data 266.

Optionally, the automated dynamic object generation system 199 may input the error model data 266 to the virtualization application 155 and the virtualization application 155 may generate the GUI data 144. An example of this implementation is depicted in FIG. 5.

Figure 5:
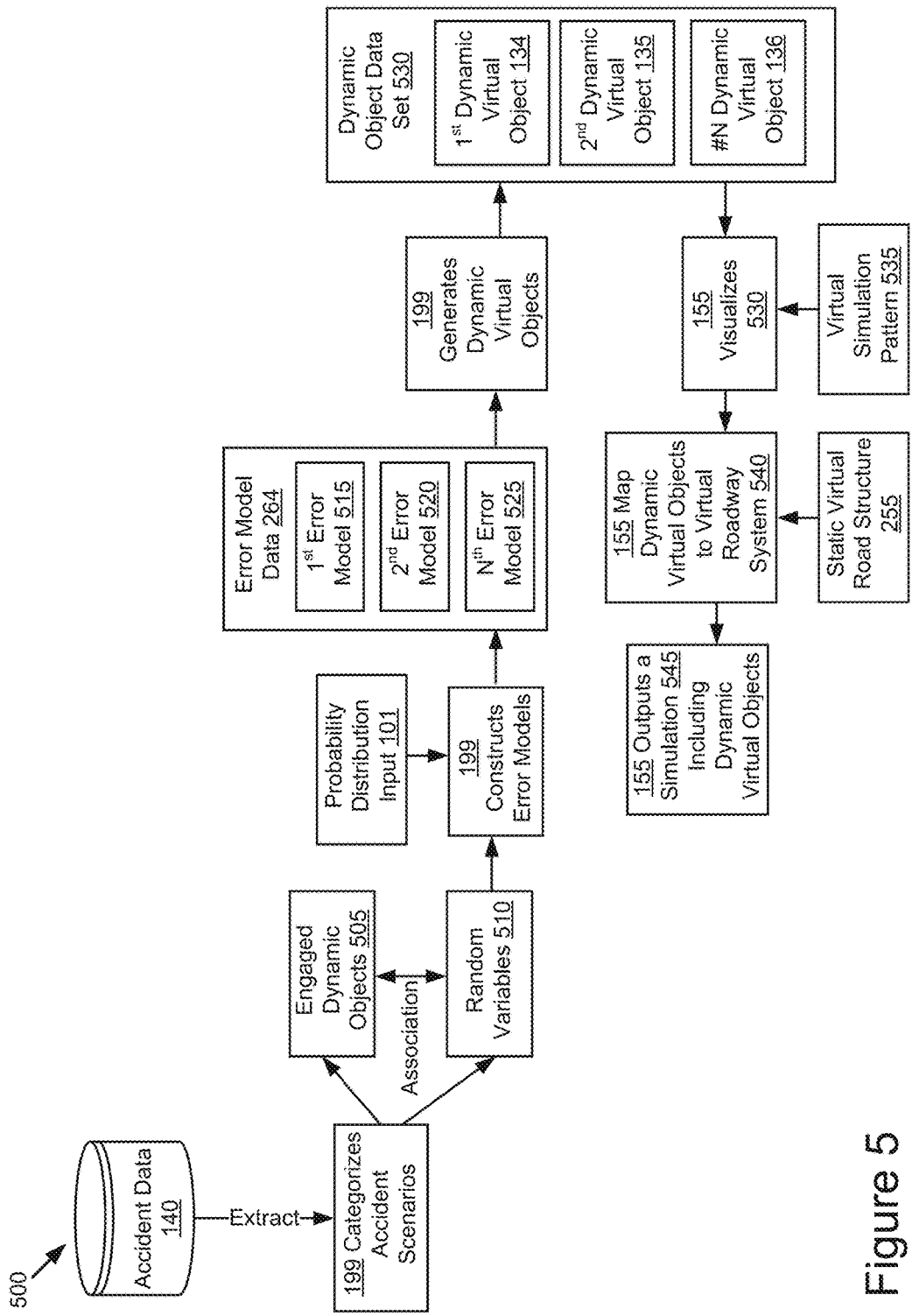
FIG. 5 is a block diagram illustrating an example process flow for the automated dynamic object generation system.

FIG. 5 is a block diagram illustrating an example process flow 500 for the automated dynamic object generation system 199.

The automated dynamic object generation system 199 extracts data from the accident data 140. The data may include object data 260 that described one or more engaged dynamic objects 505 and behavior data 262 that includes one or more random variables that are associated with the one or more engaged dynamic objects 505.

The engaged dynamic object 505 may include, for example, other vehicles, pedestrians, animals, objects, traffic lights, different road surface frictions, different visibility conditions, etc. The automated dynamic object generation system 199 may categorize accident scenarios based on the extracted data. The categories may include, for example: intersection scenarios; merging scenarios; undivided road scenarios; harsh weather scenarios; and etc.

The random variables 510 may include, for example, vehicle speed at the time of the roadway accident, vehicle trajectory at the time of the roadway accident, traffic signal status at the time of the roadway accident, etc.

The automated dynamic object generation system 199 may use the random variables 510 and a probability distribution input 101 to construct error model data 264 that describes an error model for each engaged dynamic object 505. The probably distribution input 101 may include, for example: a 5% chance that a traffic signal will not be detected; a 3% chance to invade the opposing lane; a 10% chance the driver does not see a stop sign; and etc. The depicted example in FIG. 5 may assume a batch process for multiple engaged dynamic objects 505 described by the accident data 140. The error model data 264 may include a first error model 515, a second error model 520, and an Nth error model 525, wherein the "N" indicates that there can be any positive whole number of error models described by the error model data 264.

In some implementations, the error model data 264 may include one error model for each engaged dynamic object 505 extracted from the accident data 140.

The automated dynamic object generation system 199 may use the error model data 264 to generate the dynamic object data set 530 including any positive whole number of dynamic virtual objects.

In some implementations, the dynamic object data set 530 may include one dynamic virtual object for each engaged dynamic object 505 extracted from the accident data 140.

The automated dynamic object generation system 199 may provide the dynamic object data set 530 to the virtualization application 155.

The virtualization application 155 may receive the dynamic object data set 530 and a virtual simulation pattern 535. The virtualization application 155 may generate GUI data 144 to visualize the one or more dynamic virtual objects 134, 135, 136.

The virtualization application 155 may retrieve roadway model data 255 that describes a static virtual road structure. The virtualization application 155 may generate a virtual roadway system based on the roadway model data 255. The virtualization application 155 may map 540 the visualized dynamic virtual objects 134, 135, 136 to the virtual roadway system.

The virtualization application 155 may output a simulation 545 that includes the visualized dynamic virtual objects 134, 135, 136. The simulation may include, for example: a pedestrian crossing the road by ignoring a traffic signal; a dog in the highway; a traffic signal malfunction; a sudden heavy rain; and etc.

Example GUIs

Figure 6:
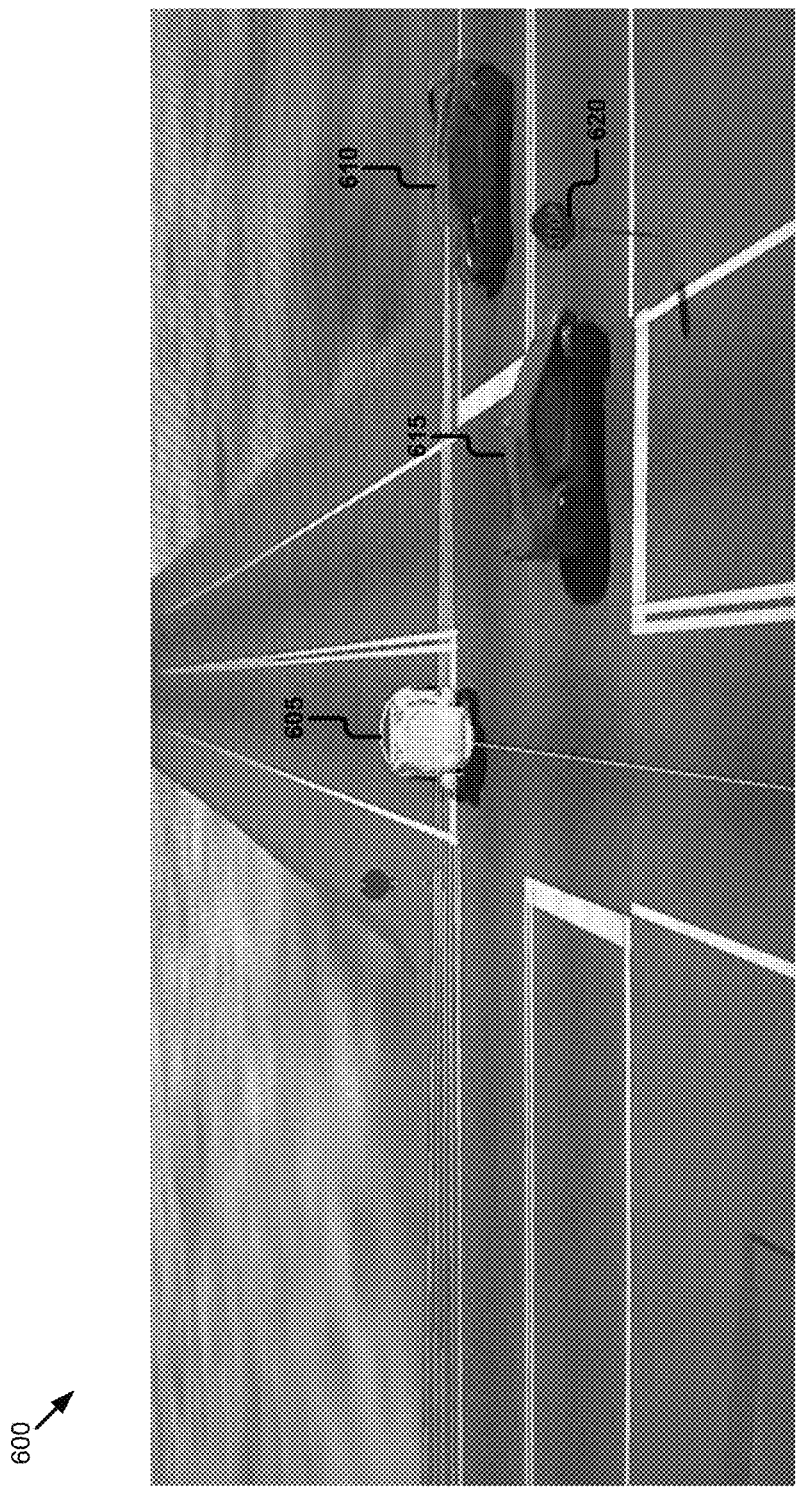
FIGS. 6, 7 and 8 are examples of graphical user interfaces that depict a simulation including dynamic virtual objects created by the automated dynamic object generation system.
Figure 7:
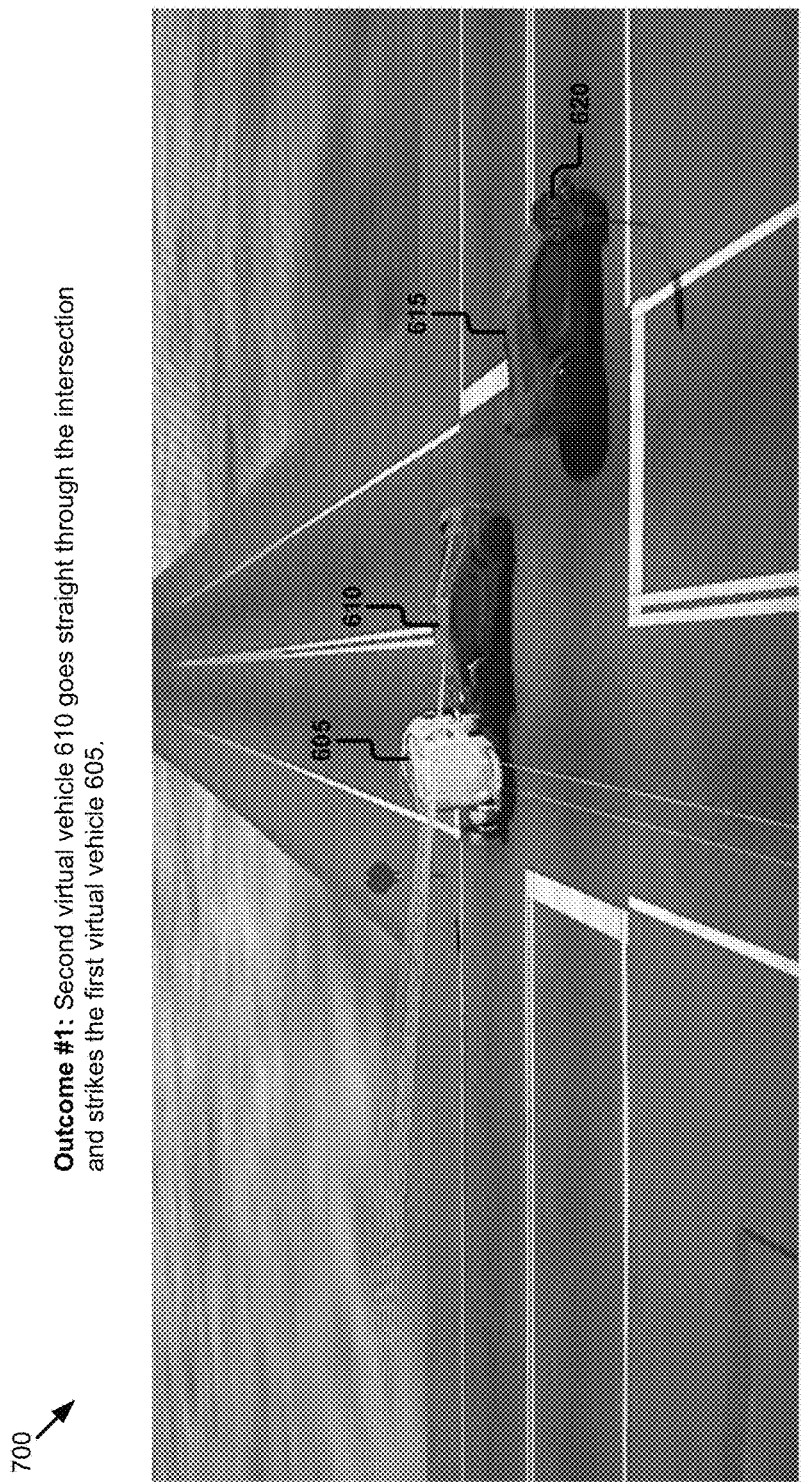
Figure 8:
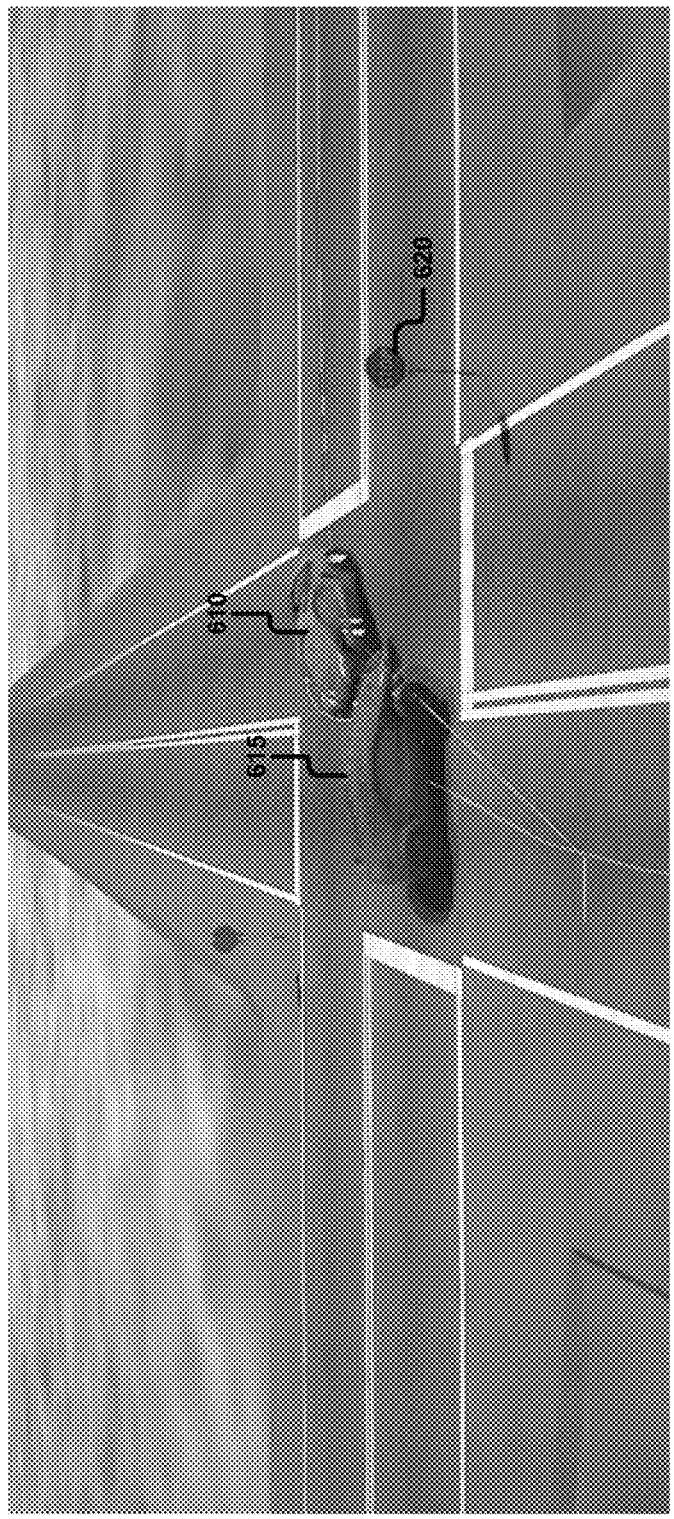

FIGS. 6, 7 and 8 are examples of GUIs 600, 700, 800 that depict a simulation including dynamic virtual objects created by the automated dynamic object generation system 199.

Referring to FIG. 6, the dynamic virtual object is the second virtual vehicle 610. The second virtual vehicle 610 is described by object data 260 extracted from the accident data 140. FIG. 6 may include an example scenario where a second virtual vehicle 610 is a dynamic virtual object that does not observe the rule of a four-way stop sign. Failing to observe the rule of the four-way stop sign may be an example of erroneous behavior. In this example, the second virtual vehicle 610 may go straight through the intersection (see, e.g., FIG. 7) or turn left (see, e.g., FIG. 8) to cause a roadway accident.

The behavior of the second virtual vehicle 610 in this example is to ignore a four-way stop sign 620 present at the intersection. This is an example of a critical reason for an occurrence of an accident.

The error model for the second virtual vehicle 610 may include one or more random variables 510 as described by the behavior data 262 extracted from the accident data 140: (1) the vehicle velocity may be greater than forty miles per hour 20% of the time; (2) the vehicle trajectory in the four-way intersection may be to drive straight through the intersection 33.3% of the time, turn left 33.3% of the time and turn right 33.3% of the time; and (3) the second virtual vehicle 610 may detect the stop sign 95% of the time. In some implementations, these random variables may be extracted from the accident data 140 by the automated dynamic object generation system 199 for many similar scenarios to determine or range of probable outcomes for this class of scenario.

Referring to FIG. 7, depicted is a GUI 700 that depicts an outcome of the scenario detected in GUI 600 described above with reference to FIG. 6 where the second virtual vehicle 610 drives straight through the intersection. In this example, the second virtual vehicle 610 collides with the first virtual vehicle 605.

A collision may indicate that the software model for the first virtual vehicle 605 may be analyzed by a vehicle design engineer to determine why the first virtual vehicle 605 did not avoid the collision.

Referring to FIG. 8, depicted is a GUI 800 that depicts an outcome of the scenario detected in GUI 600 described above with reference to FIG. 6 where the second virtual vehicle 610 turns left at the intersection. In this example, the second virtual vehicle 610 collides with the third virtual vehicle 615.

A collision may indicate that the software model for the third virtual vehicle 615 may be analyzed by a vehicle design engineer to determine why the third virtual vehicle 615 did not avoid the collision.

In the above description, for purposes of explanation, numerous specific details are set forth in order to provide a thorough understanding of this disclosure. It will be apparent, however, to one skilled in the art that the disclosure can be practiced without these specific details. In some instances, structures and devices are shown in block diagram form in order to avoid obscuring the description. For example, the present implementations can be described above primarily with reference to user interfaces and particular hardware. However, the present implementations can apply to any type of computing device that can receive data and commands, and any peripheral devices providing services.

Reference in this disclosure to "some implementations" or "some instances" means that a particular feature, structure, or characteristic described in connection with the implementations or instances can be included in at least one implementation of the description. The appearances of the phrase "in some implementations" in various places in this disclosure are not necessarily all referring to the same implementations.

Some portions of the detailed descriptions that follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms including "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission, or display devices.

The present implementations of this disclosure can also relate to an apparatus for performing the operations herein. This apparatus may be specially constructed for the required purposes, or it may include a general-purpose computer selectively activated or reconfigured by a computer program stored in the computer. Such a computer program may be stored in a computer-readable storage medium, including, but is not limited to, any type of disk including floppy disks, optical disks, CD-ROMs, and magnetic disks, read-only memories (ROMs), random access memories (RAMs), EPROMs, EEPROMs, magnetic or optical cards, flash memories including USB keys with non-volatile memory, or any type of media suitable for storing electronic instructions, each coupled to a computer system bus.

This disclosure can take the form of some entirely hardware implementations, some entirely software implementations or some implementations containing both hardware and software elements. In some preferred implementations, this disclosure is implemented in software, which includes, but is not limited to, firmware, resident software, microcode, etc.

Furthermore, the description can take the form of a computer program product accessible from a computer-usable or computer-readable medium providing program code for use by or in connection with a computer or any instruction execution system. For the purposes of this description, a computer-usable or computer-readable medium can be any apparatus that can contain, store, communicate, propagate, or transport the program for use by or in connection with the instruction execution system, apparatus, or device. The computer-readable medium may be a tangible or non-transitory computer-readable storage medium. The computer-readable medium may store computer executable code. The computer-readable medium may be communicatively coupled to a processor. The processor may be programmed to execute one or more portions of the computer-executable code.

A data processing system suitable for storing or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including, but not limited, to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modem, and Ethernet cards are just a few of the currently available types of network adapters.

Finally, the algorithms and displays presented herein are not inherently related to any particular computer or other apparatus. Various general-purpose systems may be used with programs in accordance with the teachings herein, or it may prove convenient to construct more specialized apparatus to perform the required method steps. The required structure for a variety of these systems will appear from the description below. In addition, this disclosure is not described with reference to any particular programming language. It will be appreciated that a variety of programming languages may be used to implement the teachings of this disclosure as described herein.

The foregoing description of the implementations of this disclosure has been presented for the purposes of illustration and description. It is not intended to be exhaustive or to limit this disclosure to the precise form disclosed. Many modifications and variations are possible in light of the above teaching. It is intended that the scope of the disclosure be limited not by this detailed description, but rather by the claims of this application. As will be understood by those familiar with the art, this disclosure may be embodied in other specific forms without departing from the spirit or essential characteristics thereof. Likewise, the particular naming and division of the modules, routines, features, attributes, methodologies, and other aspects are not mandatory or significant, and the mechanisms that implement this disclosure or its features may have different names, divisions, or formats. Furthermore, as will be apparent to one of ordinary skill in the relevant art, the modules, routines, features, attributes, methodologies, and other aspects of the disclosure can be implemented as software, hardware, firmware, or any combination of the three. Also, wherever a component, an example of which is a module, of this disclosure is implemented as software, the component can be implemented as a standalone program, as part of a larger program, as a plurality of separate programs, as a statically or dynamically linked library, as a kernel-loadable module, as a device driver, or in every and any other way known now or in the future to those of ordinary skill in the art of computer programming. Additionally, the disclosure is in no way limited to implementation in any specific programming language, or for any specific operating system or environment. Accordingly, the disclosure is intended to be illustrative, but not limiting, of the scope of this disclosure, which is set forth in the following claims.

What is claimed is:

1. A system to provide a graphical display output including a simulation for testing a design for a vehicle, the system comprising:
   a non-transitory memory, a processor, an automated dynamic object generation system and a virtualization application;
   wherein the non-transitory memory stores accident data that describes a roadway accident that actually occurred in a real world, a roadway model that describes a virtual roadway system for including in the simulation and a vehicle model that describes a virtual vehicle for including in the simulation;
   wherein the automated dynamic object generation system includes instructions that, responsive to being executed by the processor, cause the processor to:
      extract object data from the accident data, wherein the object data describes structural and physical properties of a real-world object included in the accident data that contributed to the roadway accident occurring in the real world;
      extract behavior data from the accident data, wherein the behavior data describes an erroneous behavior of the real-world object that contributed to the roadway accident occurring in the real world;
      receive user input data that describes a frequency of the real-world object behaving erroneously in the simulation and a severity of the erroneous behavior of the object in the simulation; and
      construct an error model that describes a virtual object that represents the real-world object in the simulation, wherein the error model is constructed based on the object data, the behavior data and the user input data so that the virtual object behaves erroneously in the simulation as described by the behavior data and the user input data;
   wherein the virtualization application includes instructions that, responsive to being executed by the processor, cause the processor to generate the graphical display output including the simulation based on the roadway model, the vehicle model and the error model, wherein the simulation includes graphics that graphically depict the virtual vehicle, the virtual roadway system and the virtual object; and
   a monitor that displays the graphical display output.

2. The system of claim 1, wherein the automated dynamic object generation system includes instructions that further cause the processor to test a performance of a vehicle design for a real-world vehicle based on the error model.

3. The system of claim 1, wherein the accident data is imported from an accident database.

4. The system of claim 1, wherein the user input data includes a probability distribution that describes the frequency and the severity.

5. The system of claim 1, wherein the virtual object and the error model are automatically generated based on a single user input.

6. The system of claim 1, wherein the automated dynamic object generation system causes the monitor to display one or more graphical fields that are usable to provide the user input data to the automated dynamic object generation system.

7. The system of claim 1, wherein the automated dynamic object generation system is a plugin for the virtualization application.

8. A method to provide a graphical display output including a simulation for testing a design for a vehicle, the method comprising:
- extracting object data from a set of accident data, wherein the object data describes structural and physical properties of a real-world object included in the accident data that contributed to a roadway accident occurring in a real world;
- extracting behavior data from the accident data, wherein the behavior data describes an erroneous behavior of the real-world object that contributed to the roadway accident occurring in the real world;
- receiving user input data that describes a frequency of the real-world object behaving erroneously in the simulation and a severity of the erroneous behavior of the real-world object in the simulation;
- constructing an error model that describes a virtual object that represents the real-world object in the simulation, wherein the error model is constructed based on the object data, the behavior data and the user input data so that the virtual object behaves in the simulation based on the behavior data and the user input data;
- generating the graphical display output including the simulation based on (1) a roadway model that describes a virtual roadway system, (2) a vehicle model that describes a virtual vehicle and (3) the error model, wherein the simulation includes graphics that graphically depict the virtual vehicle present on the virtual roadway system; and
- displaying the graphical display output on a monitor.

9. The method of claim 8, further comprising testing a performance of a vehicle design for a real-world vehicle based on the error model.

10. The method of claim 8, wherein the accident data is imported from an accident database that includes quantitative data describing the erroneous behavior of the real-world object that contributed to the roadway accident occurring in the real world.

11. The method of claim 8, wherein the user input data includes a probability distribution that describes the frequency and the severity.

12. The method of claim 8, wherein the virtual object and the error model are automatically generated based on a single user input.

13. The method of claim 8, wherein the virtual vehicle represents an autonomous vehicle and the virtual object is present in the simulation to test how the design for the autonomous vehicle responds to the behavior of the virtual object in the simulation.

14. The method of claim 8, wherein the simulation includes a positive whole number of the virtual objects based on the user input data.

15. A non-transitory memory comprising computer code which, when executed by a processor, causes the processor to perform steps to provide a graphical display output including a simulation for testing a design for a vehicle, the steps comprising:
- extracting object data from a set of accident data stored on a non-transitory memory, wherein the object data describes structural and physical properties of a real-world object included in the accident data that contributed to a roadway accident occurring in a real world;
- extracting behavior data from the accident data, wherein the behavior data describes an erroneous behavior of the real-world object that contributed to the roadway accident occurring in the real world;
- receiving user input data that describes a frequency of the real-world object behaving erroneously in the simulation and a severity of the erroneous behavior of the real-world object in the simulation;
- constructing an error model that describes a virtual object that represents the real-world object in the simulation, wherein the error model is constructed based on the object data, the behavior data and the user input data so that the virtual object behaves in the simulation based on the behavior data and the user input data;
- generating the graphical display output including the simulation based on (1) a roadway model that describes a virtual roadway system, (2) a vehicle model that describes a virtual vehicle and (3) the error model, wherein the simulation includes graphics that graphically depict the virtual vehicle present on the virtual roadway system that includes the virtual object behaving dynamically in the simulation based on the error model; and
- displaying the graphical display output on a monitor.

16. The non-transitory memory of claim 15, wherein the steps further include testing a performance of a vehicle design for a real-world vehicle based on the error model.

17. The non-transitory memory of claim 15, wherein the accident data is imported from one or more accident databases that includes quantitative data describing the erroneous behavior of the real-world object that contributed to the roadway accident occurring in the real world.

18. The non-transitory memory of claim 15, wherein the user input data includes a probability distribution that describes the frequency and the severity.

19. The non-transitory memory of claim 15, wherein the virtual object and the error model are automatically generated based on a single user input.

20. The non-transitory memory of claim 15, wherein the virtual vehicle represents an autonomous vehicle and the virtual object is present in the simulation to test how the design for the autonomous vehicle responds to the behavior of the virtual object in the simulation.

* * * * *